(12) United States Patent
Uenishi et al.

(10) Patent No.: US 6,838,374 B2
(45) Date of Patent: Jan. 4, 2005

(54) SEMICONDUCTOR INTEGRATED CIRCUIT DEVICE AND METHOD OF FABRICATING THE SAME

(75) Inventors: Toshiya Uenishi, Akishima (JP); Satoshi Meguro, Hinode (JP); Masaharu Kubo, Hachioji (JP); Masataka Kato, Koganei (JP); Hideo Miura, Koshigaya (JP); Norio Suzuki, Mito (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/170,359

(22) Filed: Jun. 14, 2002

(65) Prior Publication Data
US 2003/0003644 A1 Jan. 2, 2003

(30) Foreign Application Priority Data
Jun. 29, 2001 (JP) ........................................ 2001-198490

(51) Int. Cl.$^7$ ........................................ H01L 21/4763
(52) U.S. Cl. ........................................ 438/637; 438/424
(58) Field of Search ................................ 438/435, 637

(56) References Cited
U.S. PATENT DOCUMENTS
5,801,082 A * 9/1998 Tseng ........................ 438/424

6,211,021 B1   4/2001 Wang et al.
6,245,639 B1 * 6/2001 Tsai et al. .................... 438/424
6,287,939 B1 * 9/2001 Huang et al. ................ 438/435

FOREIGN PATENT DOCUMENTS

| JP | 08227938 | 9/1996 |
|----|----------|--------|
| JP | 2000-31267 | 1/2000 |
| JP | 2000-306990 | 11/2000 |

* cited by examiner

*Primary Examiner*—David Nelms
*Assistant Examiner*—Thao P. Le
(74) *Attorney, Agent, or Firm*—Antonelli, Terry, Stout & Kraus, LLP

(57) ABSTRACT

To suppress oxidation of the inner walls of element isolation grooves otherwise occurring during thermal oxidation processes, a nitrogen introducing layer, that has a lower diffusion coefficient relative to an oxidizing agent, is formed at the surface portion of a silicon oxide film buried within an element isolation groove. This nitrogen introduced layer functions as a barrier layer for precluding the oxidizer (such as oxygen, water or the like) in vapor phase from diffusing into the silicon oxide film during thermal processing steps. The nitrogen introduced layer is formed by performing nitrogen ion implantation into the entire surface of a substrate and subsequently applying thermal processing to the substrate to thereby activate the nitrogen that has been doped.

21 Claims, 48 Drawing Sheets

SEMICONDUCTOR INTEGRATED CIRCUIT DEVICE AND METHOD OF FABRICATING THE SAME

BACKGROUND OF THE INVENTION

The present invention relates in general to semiconductor integrated circuit devices and methods of fabrication thereof; and, more particularly, the invention relates to useful techniques for application to semiconductor integrated circuit devices having circuit element isolation grooves, with an insulative film buried within a groove, as formed in a semiconductor substrate.

With an increase in miniaturization or reduction in the size of semiconductor devices for use as on-chip circuit elements, a new element isolation technique has been employed in lieu of prior known local oxidation of silicon (LOCOS) methods. This element isolation technique is one that embeds or buries a silicon oxide film within a groove formed in a semiconductor substrate to thereby form more than one element isolation groove. This technique is also known as the shallow trench isolation (STI) process.

To form an element isolation groove, the process starts with a step of applying thermal processing to the semiconductor substrate (simply referred to as a "substrate" hereinafter) for fabrication of a thin silicon oxide film (also called a pad oxide film) on or above its surface. This pad oxide film is formed for purposes of relaxation of stresses being applied to the substrate which occur during baking for densification of the oxide silicon film buried within the groove, which is carried out at a later step, and also for protection of active regions during removal of a silicon nitride film that is used as a mask for oxidation.

Next, the process has a step of depositing a silicon nitride film at an upper part of the pad oxide film using chemical vapor deposition (CVD) techniques and then remove portions of the silicon nitride film which reside in element isolation regions by etching using a patterned photoresist film as a mask. This silicon nitride film is used as a mask during formation of a groove(s) through etching of the substrate along with a protective film for protection of its underlying substrate surface against oxidation.

Next, after having formed a groove in the substrate by dry etching using the silicon nitride film as a mask, the substrate is thermally oxidized to thereby fabricate a thin silicon oxide film on the inner walls of the groove. This silicon oxide film is formed for purposes of removal of etching damage occurring at the groove inner walls and also stress relaxation of a silicon oxide film to be buried within the groove at a later step.

Next, after having deposited a silicon oxide film by CVD over the substrate to bury it within the groove, the substrate is thermally processed to thereby densify this silicon oxide film. This densification is for effecting improvement in the film quality of the silicon oxide film buried within the groove.

Next, the process has a step of removing the silicon oxide film overlying the silicon nitride film by chemical-mechanical polishing (CMP) techniques causing the silicon oxide film to remain within the groove, thus completing more than one element isolation groove. Thereafter, the silicon nitride film that has been used as a mask during formation of the groove in the substrate is removed by wet etch techniques, thus forming, in active regions, semiconductor circuit elements, such as metal insulator semiconductor field effect transistors (MISFETs).

Unfortunately, it has been pointed out that the element isolation groove as formed by the above-discussed methodology suffers from degradation in device characteristics. This can occur due to a mechanism which will be described as follows. At several thermal oxidation process steps during fabrication of semiconductor elements in active regions, oxidizing agents or oxidizers, such as oxygen and water components in the atmosphere, behave to invade the inside of an element isolation groove and then oxidize the inner walls thereof, resulting in formation of a silicon oxide film. Due to thermal volume expansion of such silicon oxide film, the active region is subjected to a compressive stress force. This stress application can result in creation of unwanted crystal defects and/or dislocations at a portion of the substrate in the active region, causing the device characteristics to degrade. In view of the fact that the compressive stress being applied to the active region by oxidation of the isolation groove inner walls increases with a decrease in isolation groove width, resulting from a decrease in the feature size of on-chip semiconductor devices, this problem is a serious bar to successful achievement of miniaturization or reduction in the size of the semiconductor devices.

Another problem associated with the above-stated element isolation groove, as has been reported to date, is that a drain current can rush to flow even upon application of a low gate voltage. This is called the "kink" or "hump" characteristics among experts in the semiconductor device art. This problem occurs due to a mechanism which will be described as follows. The silicon oxide film buried in a groove is etched away through more than two hydrofluoric-acid cleaning process steps to be carried out during formation of a semiconductor circuit element in an active region, resulting in a portion of the silicon oxide film at an element isolation groove edge being retrograded or "recessed" downwardly, which in turn causes a gate insulating film, that has been formed over a substrate surface portion of the active region, to locally decrease in thickness. This local thinning of such gate insulating film leads to undesired drain current flow even upon application of a low gate voltage.

One prior known approach to suppressing oxidation in the inner walls of element isolation grooves is to fabricate a thin silicon nitride film along the isolation groove inner walls in a way as taught, for example, in U.S. Pat. No. 5,447,884.

In addition, JP-A-2000-31267 discloses therein a remedy for formation of an unwanted groove at the outer periphery of an element isolation groove due to simultaneous etching of an oxidation-preventing silicon nitride film formed on isolation groove inner walls during removal by wet etching of a mask-use silicon nitride film that is used for formation of grooves in a substrate, wherein the remedy employs a technique for increasing its etching rate by doping, through ion implantation, a chosen impurity into the silicon nitride mask to thereby damage it.

JP-A-2000-306990 discloses therein a remedy for preventing the silicon nitride film within an element isolation groove from being recessed due to unintentional etching during removal by wet etching of a pad oxide film that has been formed beneath the mask-use silicon nitride film, wherein the remedy makes use of a technique for applying thermal processing to the silicon oxide film within the isolation groove in a nitride gaseous atmosphere after having etched away the silicon nitride mask and yet prior to removal of the pad oxide film.

Considering the technology from a different viewpoint from the problem stated above, JP-A-8-227938 discloses a remedy for precluding undesired etching of the silicon oxide film within an element isolation groove, that occurs as a result of overlapping of a portion of a through-going hole with the isolation groove due to possible mask positioning/alignment deviation during formation of the through-hole deep enough to reach its underlying substrate, by etching of a silicon oxide film that has been deposited over the substrate, by use of a technique for forming a silicon nitride film overlying the silicon oxide film within the isolation groove, to thereby use this silicon nitride film as an etching stopper during formation of the through-hole.

SUMMARY OF THE INVENTION

In recent years, in the manufacture of a variety of types of metal oxide semiconductor (MOS) devices, including but not limited to complementary MOS (CMOS) devices, with a plurality of types of MISFETs having different gate insulating film thicknesses from one another, being formed on or over the same substrate, an increased number of hydrofluoric-acid cleaning and thermal oxidation process steps are required, which are to be carried out at a stage between element isolation groove formation and the fabrication of the MISFETs. Due to this, with the related art methods stated supra, it becomes difficult to effectively suppress element isolation groove inner wall oxidation and/or silicon oxide film retrogradation (recessing) at element isolation groove terminate end/edge portions, which would result in a decrease in the reliability and mass-production yield of the MOS devices.

It is therefore a primary object of the present invention to provide a technique for effectively suppressing oxidation on inner walls of circuit element isolation grooves otherwise occurring during thermal oxidation processes.

It is another object of this invention to provide a technique for successfully suppressing retrogradation (recessing) of element isolation groove end portions otherwise occurring during hydrofluoric acid cleaning processes.

These and other objects, features and advantages of the invention will be apparent from the following more particular description of preferred embodiments of the invention, as illustrated in the accompanying drawings.

A brief description of some representative ones of the inventive principles as disclosed and claimed herein will be presented as follows.

A semiconductor integrated circuit device of the present invention comprises a semiconductor substrate having at its principal surface a first area and a second area planarly surrounded by the first area, a first insulative film formed over the principal surface of the semiconductor substrate in the second area, a conductor piece formed over the first insulative film, a semiconductor region formed at the semiconductor substrate principal surface on both sides of the conductor piece, and an oxide film formed at the semiconductor substrate principal surface in the first area and having a film thickness greater than that of the first insulative film, wherein nitrogen is introduced at a surface portion of the oxide film.

A method of fabricating a semiconductor integrated circuit device of the instant invention includes the steps of:

(a) exposing a first area of a semiconductor substrate principal surface to thereby selectively form a first insulative film at the semiconductor substrate principal surface in a second area surrounded by the first area;

(b) forming a groove in the semiconductor substrate surface in the first area;

(c) forming a second insulative film within the groove and over the first insulative film in such a way as to bury the groove;

(d) applying polishing to the second insulative film to thereby permit the second insulative film to selectively reside within the groove;

(e) introducing nitrogen into the second insulative film within the groove;

(f) removing the first insulative film of the second area;

(g) forming a third insulative film at the semiconductor substrate surface in the second area;

(h) forming a conductor piece over the third insulative film; and (i) introducing in the second area an impurity into the semiconductor substrate surface on both sides of the conductor piece.

DESCRIPTION OF THE PREFERRED EMBODIMENTS

Figure 1:
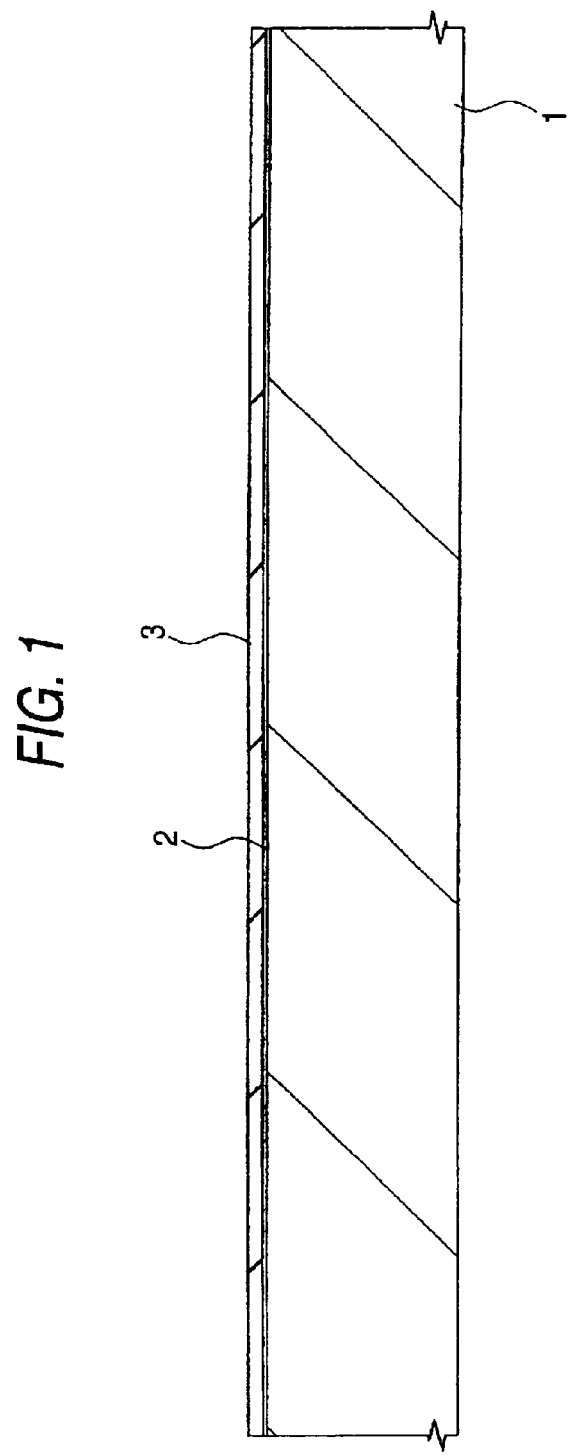
FIG. 1 is a diagram illustrating, in cross-section, a main part of a semiconductor substrate in a step of a method of fabricating a semiconductor integrated circuit device in accordance with one embodiment of the present invention.

Several preferred embodiments of the present invention will now be described in detail with reference to the accompanying drawings. Note that in all of the drawings, those elements having the same functions are designated by the same reference characters with any repetitive explanations thereof being omitted.

Embodiment 1:

A complementary MISFET (CMOSFET) fabrication method in accordance with a first embodiment of the invention will be explained with reference to FIGS. 1 through 25.

Initially as shown in FIG. 1, a substrate 1 made of p-type single-crystalline silicon having a resistivity of 1 to 10 Ωcm, for example, is subjected to thermal oxidation at approximately 850° C. to thereby fabricate on its surface a thin silicon oxide film (pad oxide film) 2 to a thickness of about 10 nm; thereafter, using chemical vapor deposition (CVD) techniques, a silicon nitride film 3 is deposited with a thickness of about 120 nm on the silicon oxide film 2.

The silicon oxide film 2 is formed for relaxation of any possible stress occurring at an interface between the substrate 1 and silicon nitride film 3, to thereby preclude creation of crystal defects, such as dislocations or the like, at the surface of substrate 1 due to this stress. The silicon nitride film 3 is provided for use as a mask during formation of more than one groove through selective etching of specified portions of the substrate 1 which reside in circuit element isolation regions. The silicon nitride film 3 is hardly oxidizable in nature, and thus it is used also as a protective film for prevention of any unwanted oxidation at the surface of its underlying substrate 1.

Figure 2:
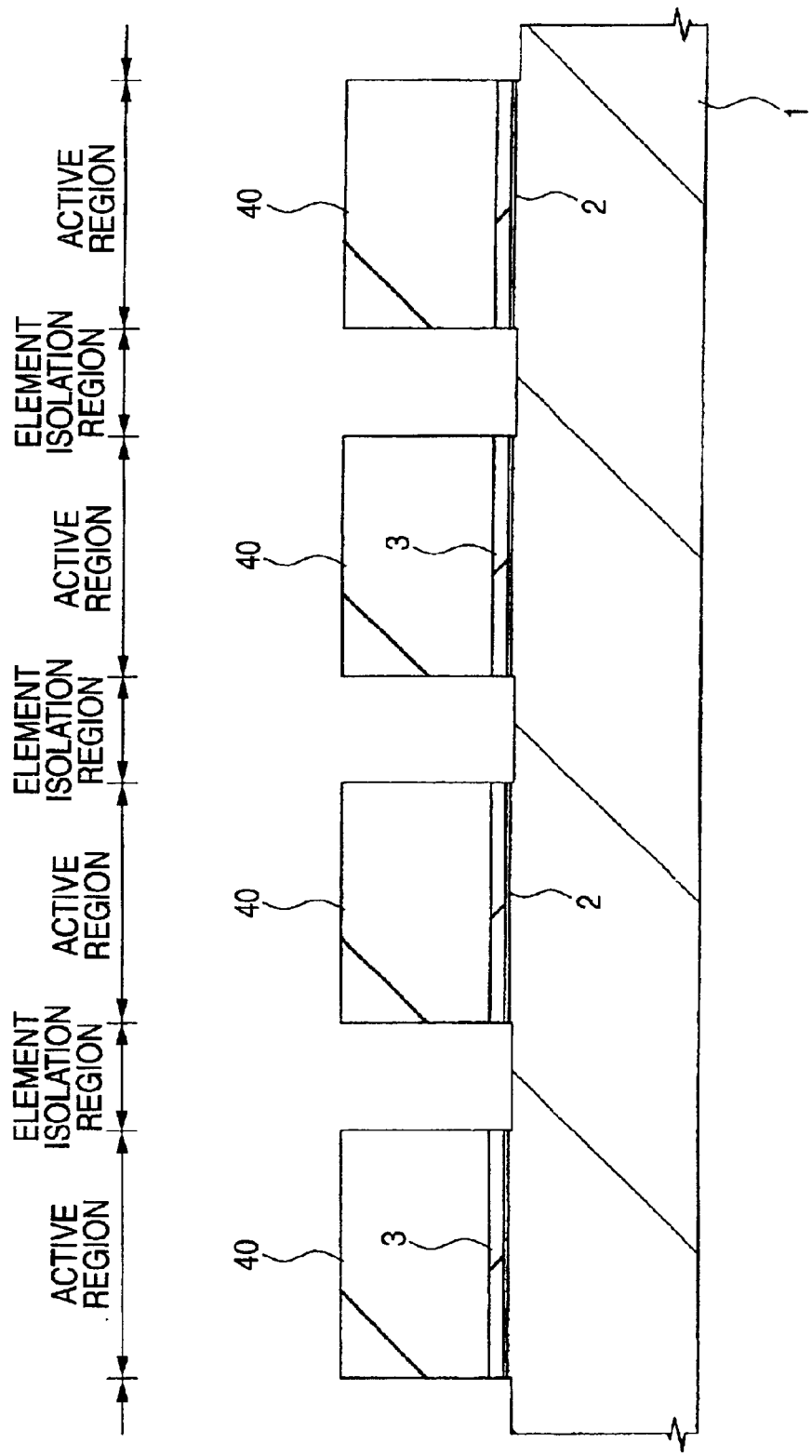
FIG. 2 is a diagram depicting, in cross-section, a main part of the semiconductor substrate in a step of the semiconductor integrated circuit device fabrication method in accordance with the embodiment of this invention.

Next, as shown in FIG. 2, selected portions of the silicon nitride film 3 and silicon oxide film 2 in the element isolation regions are subjected to a dry etching process with a photoresist film 40, as formed on the silicon nitride film 3 in the active regions, being used as a mask, to thereby cause the substrate 1 to be exposed at its surface portions in the element isolation regions.

Figure 3:
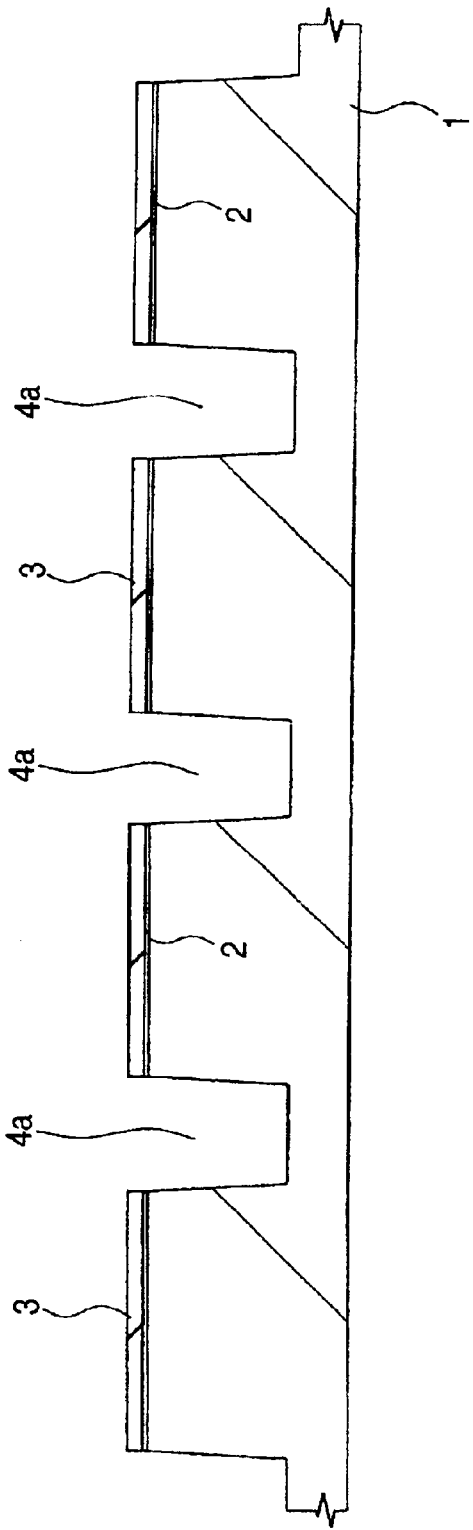
FIG. 3 is a diagram showing, in cross-section, a main part of the semiconductor substrate in a step of the semiconductor integrated circuit device fabrication method in accordance with the embodiment of the invention.

Next, after having removed the photoresist film 40, the silicon nitride film 3 is used as a mask to apply dry etching to the substrate 1 in the element isolation regions, thereby forming grooves 4a to a depth of 350 nm, as shown in FIG. 3.

Figure 4:
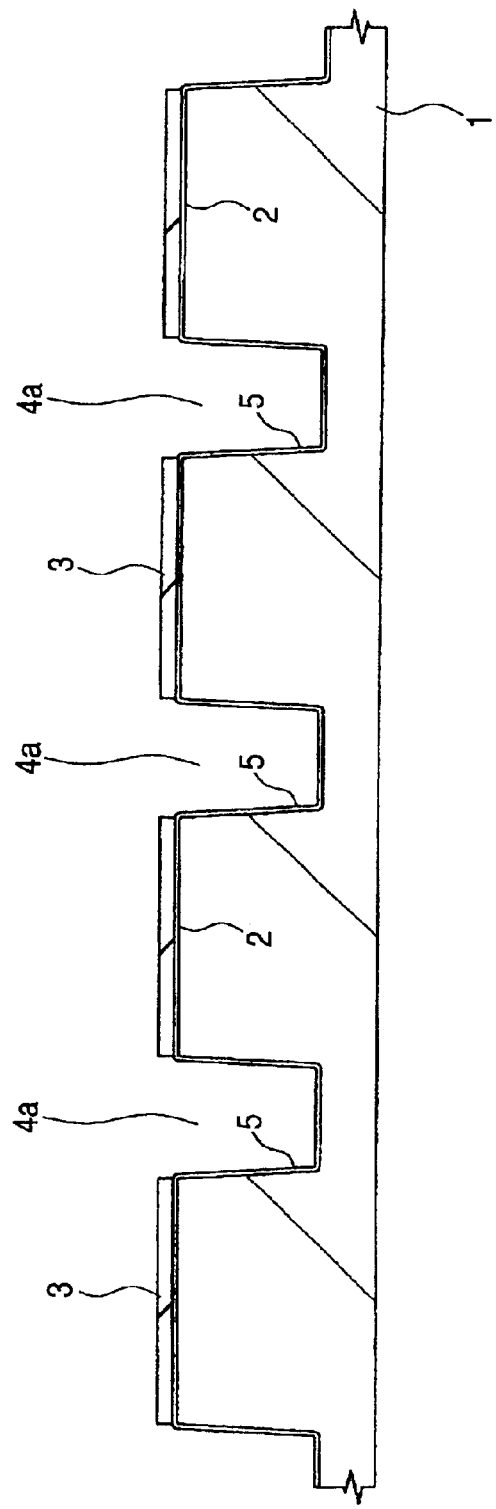
FIG. 4 is a cross-sectional diagram of a main part of the semiconductor substrate showing a step of the semiconductor integrated circuit device fabrication method in accordance with the embodiment of the invention.

Next, after completion of cleaning of the resultant exposed surface portions of the substrate 1 to inner walls of the grooves 4a by use of SC-1 liquid (mixture solution of ammonia water and hydrogen peroxide water), SC-2 (mixture of hydrochloric acid and hydrogen peroxide water) and hydrofluoric acid (or alternatively hydrofluoric-acid/ammonia-water mixture), the substrate 1 is thermally oxidized at about 800 to 900° C., as shown in FIG. 4, thus forming on the inner walls of each groove 4a a thin silicon oxide film 5 with a thickness of about 10 nm. The silicon oxide film 5 is formed for recovery of dry etching damage occurring at the inner walls of groove 4a, while at the same time lessening or "relaxing" stress occurring at an interface between the substrate 1 and a silicon oxide film 6 to be later buried within the individual groove 4a.

Figure 5:
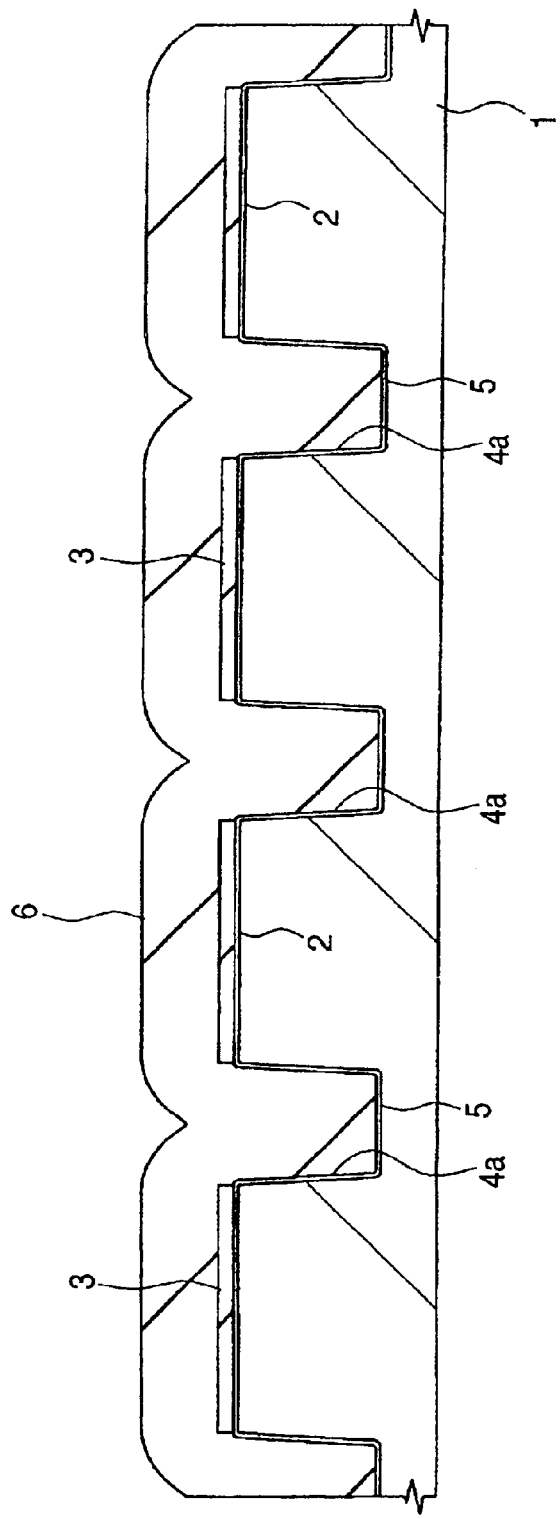
FIG. 5 is a cross-sectional diagram of a main part of the semiconductor substrate showing a step of the semiconductor integrated circuit device fabrication method in accordance with the embodiment of the invention.

Next, as shown in FIG. 5, a CVD method is used to deposit a silicon oxide film 6 over the substrate 1 to a thickness of about 450 to 500 nm. The silicon oxide film 6 is completely buried within each groove 4a in such a way that this film 6 is deposited by step coverage-excellent film fabrication methods, such as CVD techniques, with oxygen and tetraethoxysilane $((C_2H_5)_4Si)$ being used as source gases, by way of example.

Figure 6:
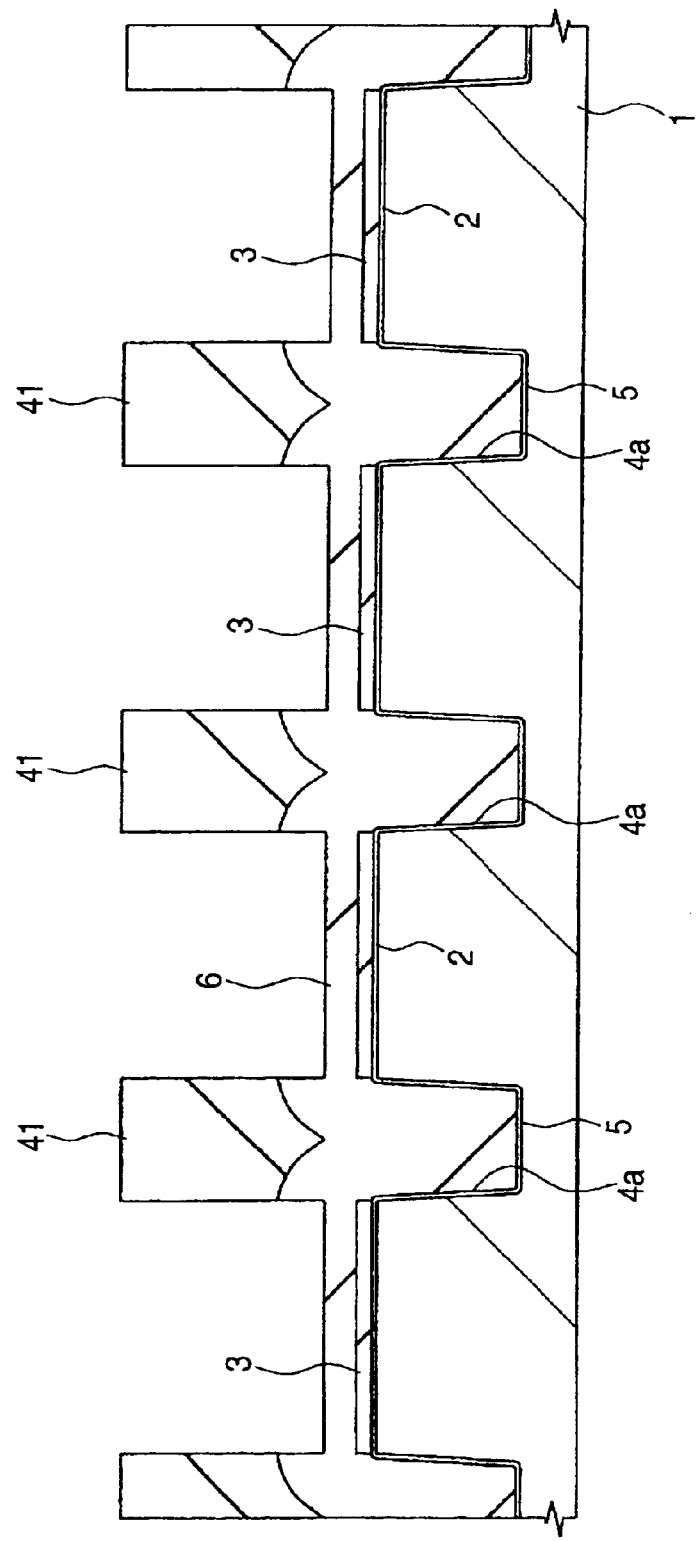
FIG. 6 is a cross-sectional diagram of a main part of the semiconductor substrate showing a step of the semiconductor integrated circuit device fabrication method in accordance with the embodiment of the invention.

Next, after having thermally processed the substrate 1 at about 900° C. and densified the silicon oxide film 6 to thereby make the film denser, the silicon oxide film 6 is dry-etched partway at its portions in the active regions using a photoresist film 41 that is formed at an upper part of the grooves 4a as a mask, as shown in FIG. 6, thereby letting the surface height of the silicon oxide film 6 in the active regions to be substantially the same as that in the element isolation regions. It should be noted here that the densification of the silicon oxide film 6 may alternatively be carried out after this dry etch process. If this is the case, it is possible to shorten the length of the time period taken for densification. This is so because the silicon oxide film 6 is reduced in thickness compared to its thickness before dry etching.

Figure 7:
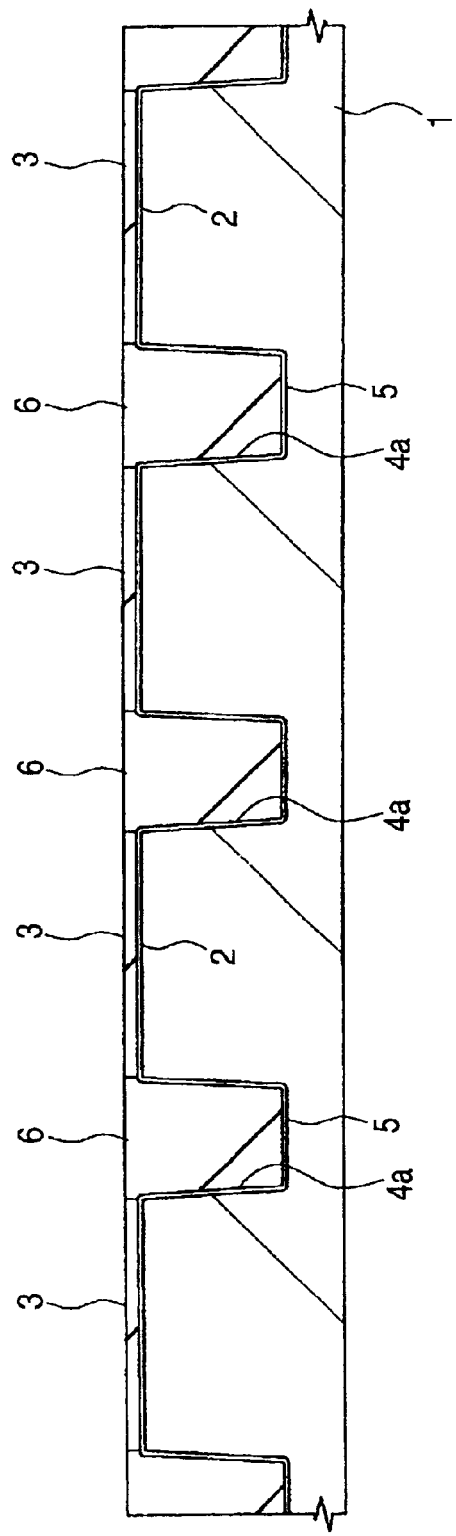
FIG. 7 is a cross-sectional diagram of a main part of the semiconductor substrate showing a step of the semiconductor integrated circuit device fabrication method in accordance with the embodiment of the invention.

Next, as shown in FIG. 7, after the removal of the photoresist film 41, chemical mechanical polishing (CMP) techniques are used to polish the silicon oxide film 6 for planarization of its surface. This polishing is done while using the silicon nitride film 3 that covers the substrate 1 in the active regions as a stopper and is terminated when the surface of the silicon nitride film 3 is exposed—that is, at a time point when the surface of the silicon nitride film 3 becomes coplanar with the surface of the silicon oxide film 6 within each groove 4a.

Figure 8:
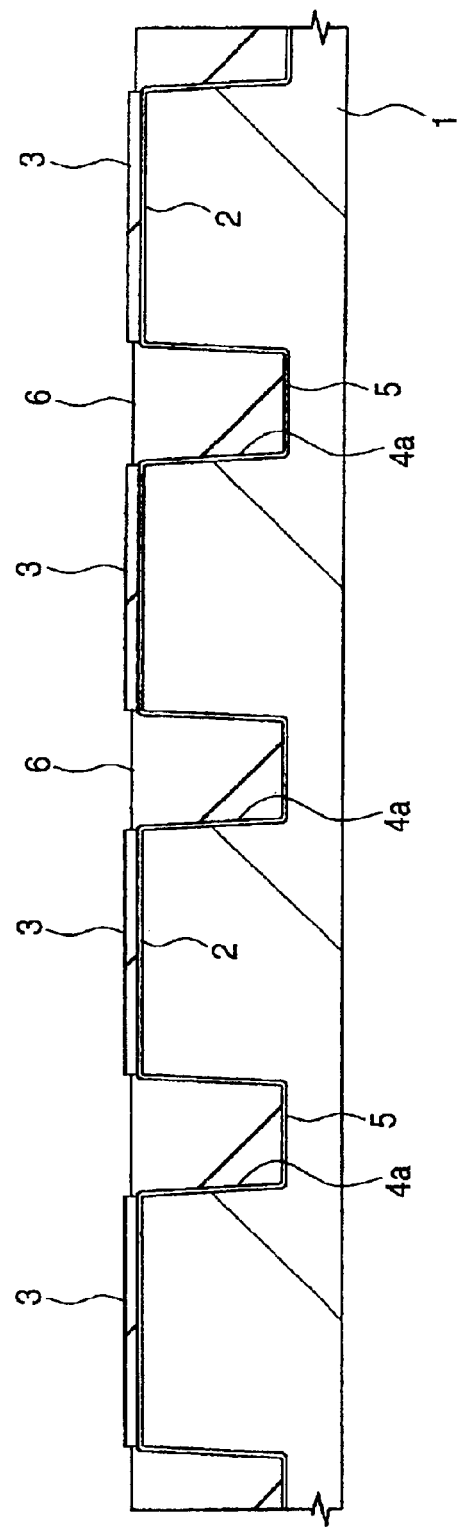
FIG. 8 is a cross-sectional diagram of a main part of the semiconductor substrate showing a step of the semiconductor integrated circuit device fabrication method in accordance with the embodiment of the invention.
Figure 9:
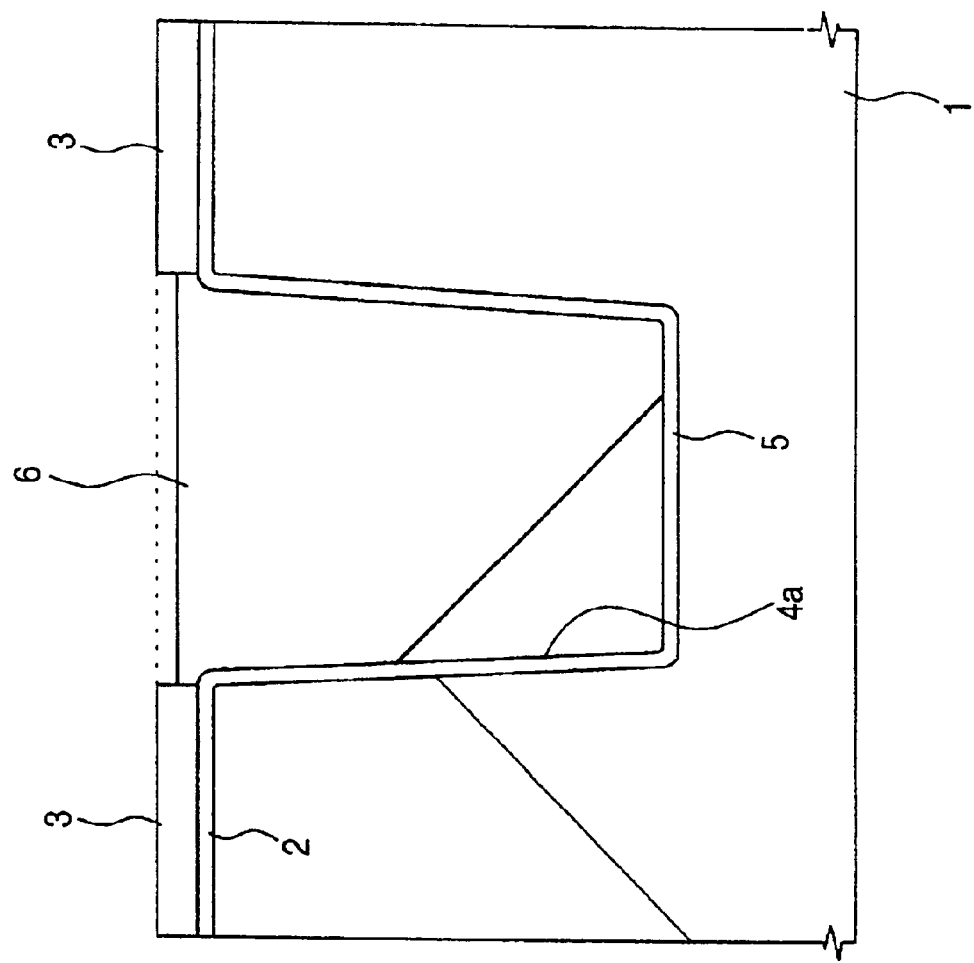
FIG. 9 is an enlarged cross-sectional diagram of a main part of the semiconductor substrate showing a step of the semiconductor integrated circuit device fabrication method in accordance with the embodiment of the invention.

Next, as shown in FIG. 8 and FIG. 9 (diagram enlarged to show the main part of the structure shown in FIG. 8), the surface of the silicon oxide film 6 within each groove 4a is wet-etched using either hydrofluoric acid or a hydrofluoric acid buffer solution (liquid mixture of hydrofluoric acid and ammonia water), thereby causing the surface of the silicon oxide film 6 to slightly retrograde or regress downwardly. Although this wet etching is not an essential process, in case the difference in level between the surface of the silicon oxide film 6 and the surface of the substrate 1 is relatively large, nitrogen to be doped by ion implantation into the silicon oxide film 6 at the next step will possibly fail to reach a region deeper than the surface of the substrate 1. Accordingly, in such a case, the above-noted wet etching is effectuated, thereby causing the surface of the silicon oxide film 6 to have a downward retrogradation to thereby lessen the level difference relative to the surface of the substrate 1.

Figure 10:
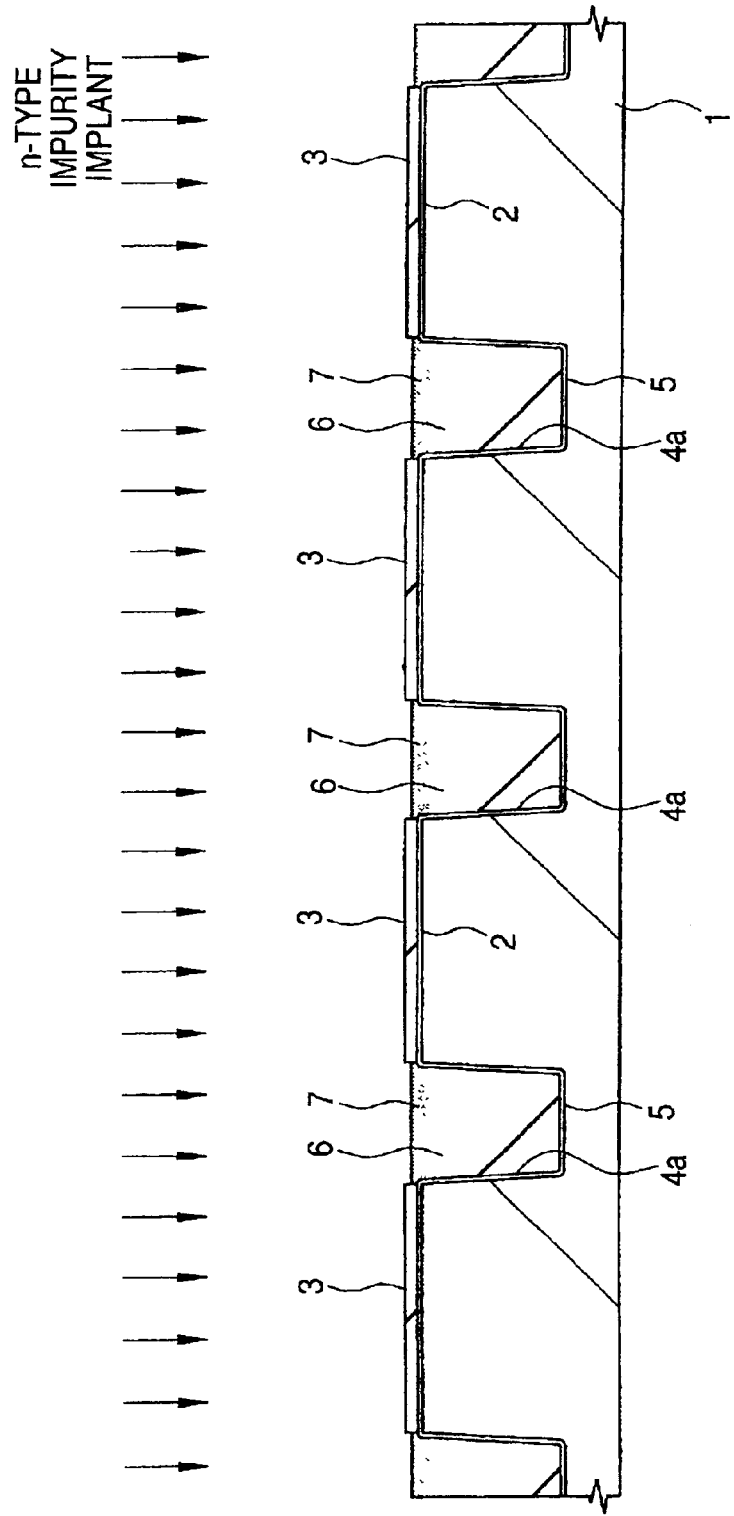
FIG. 10 is a cross-sectional diagram of a main part of the semiconductor substrate showing a step of the semiconductor integrated circuit device fabrication method in accordance with the embodiment of the invention.
Figure 11:
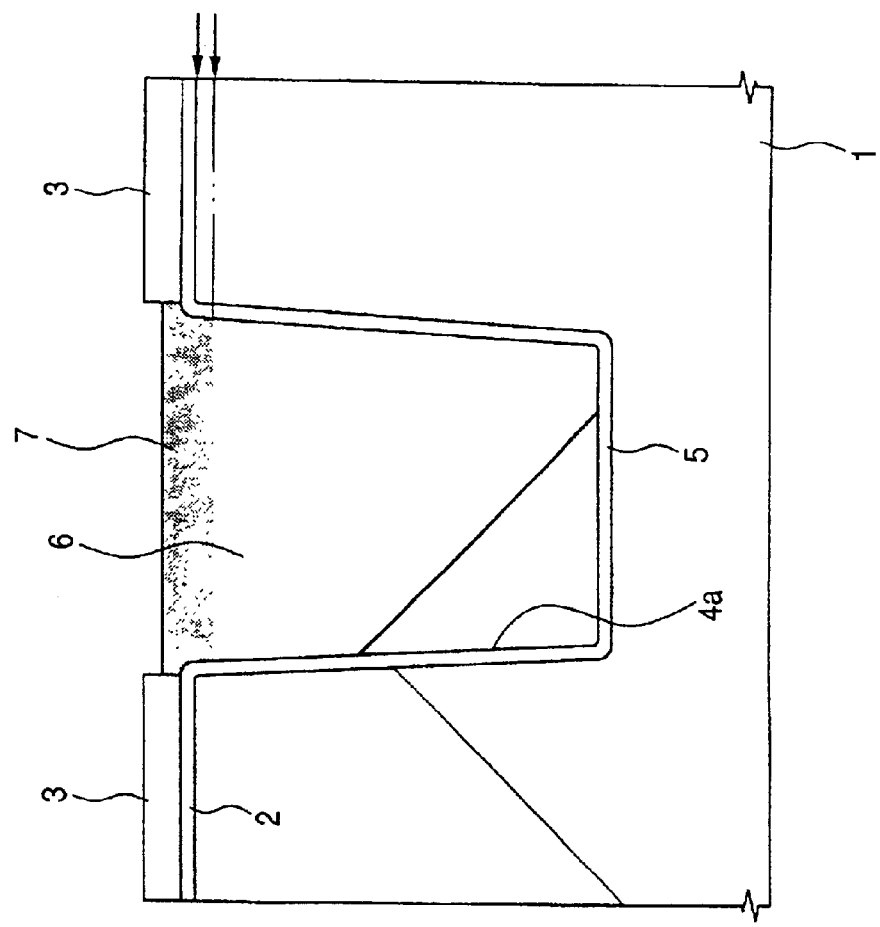
FIG. 11 is an enlarged cross-sectional diagram of a main part of the semiconductor substrate showing a step of the semiconductor integrated circuit device fabrication method in accordance with the embodiment of the invention.

Next, as shown in FIG. 10, nitrogen is ion-implanted into the entire surface of the substrate 1; and, subsequently, the substrate 1 is thermally processed to activate the nitrogen that has been doped, whereby a nitrogen introduction layer 7 is formed at a selected surface portion of the silicon oxide film 6. At this time, it is desirable that the dose amount or "dosage" of nitrogen be set at $1 \times 10^{15}/cm^2$ or greater.

During ion implantation of nitrogen into the substrate 1, the acceleration energy of nitrogen ions is controlled to ensure that a bottom portion of the nitrogen introduced layer 7 reaches a level lower than the surface of a portion of the substrate 1 in an active region, while, at the same time, letting the thickness from the surface of the nitrogen introduced layer 7 to its bottom measure 10 nm or more.

Additionally, upon introduction of nitrogen ions into the surface of substrate 1 in the active region, an undesired energy level can be formed at an interface between the substrate 1 and the gate insulating film of a MISFET to be later fabricated, resulting in a decrease in breakdown voltage of the gate insulating film and/or a variation in threshold voltage of the MISFET. Accordingly, in the event that the substrate 1 is doped with nitrogen by ion implantation, the acceleration energy of nitrogen ions is appropriately controlled to prevent arrival of nitrogen ions at the surface of the substrate 1 after penetration of the silicon nitride film 3.

The nitrogen introduced layer 7, as formed at the surface portion of silicon oxide film 6, has a structure similar to so-called silicon oxynitride (SiON), with part of the Si—O coupling or bonding for constitution of the silicon oxide film 6 being replaced by a Si—N bond, which is characterized in the fact that the diffusion coefficient relative to oxidizers, such as oxygen and/or water, is noticeably less. More specifically, the nitrogen introduced layer 7 formed at the surface portion of the silicon oxide film 6 is expected to function as a barrier layer for suppression of diffusion of an oxidizer in gas phase into the silicon oxide film 6 during thermal processing of the substrate 1 in an oxidizing atmosphere, thereby suppressing oxidation of the inner walls of the grooves 4a.

Another feature of the above-noted nitrogen introduced layer 7, partially containing therein Si—N bonds, is that the etching rate relative to hydrofluoric acid is lower than that of silicon oxides. In other words, the nitrogen introduced layer 7 may also function as a barrier layer for suppression of over-etching of the surface of the silicon oxide film 6, while the surface of substrate 1 undergoes wet cleaning by hydrofluoric acid or a hydrofluoric acid buffer liquid, thereby suppressing recessing at element isolation groove end portions, which recessing would pose a problem during the wet cleaning process.

Figure 12:
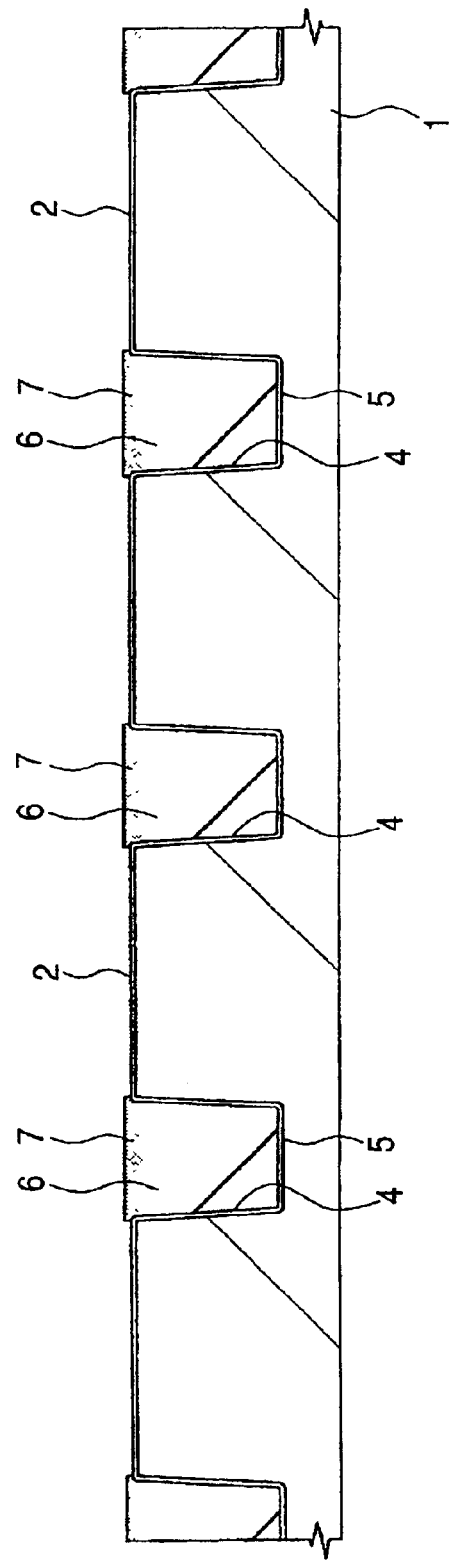
FIG. 12 is a cross-sectional diagram of a main part of the semiconductor substrate showing a step of the semiconductor integrated circuit device fabrication method in accordance with the embodiment of the invention.
Figure 13:
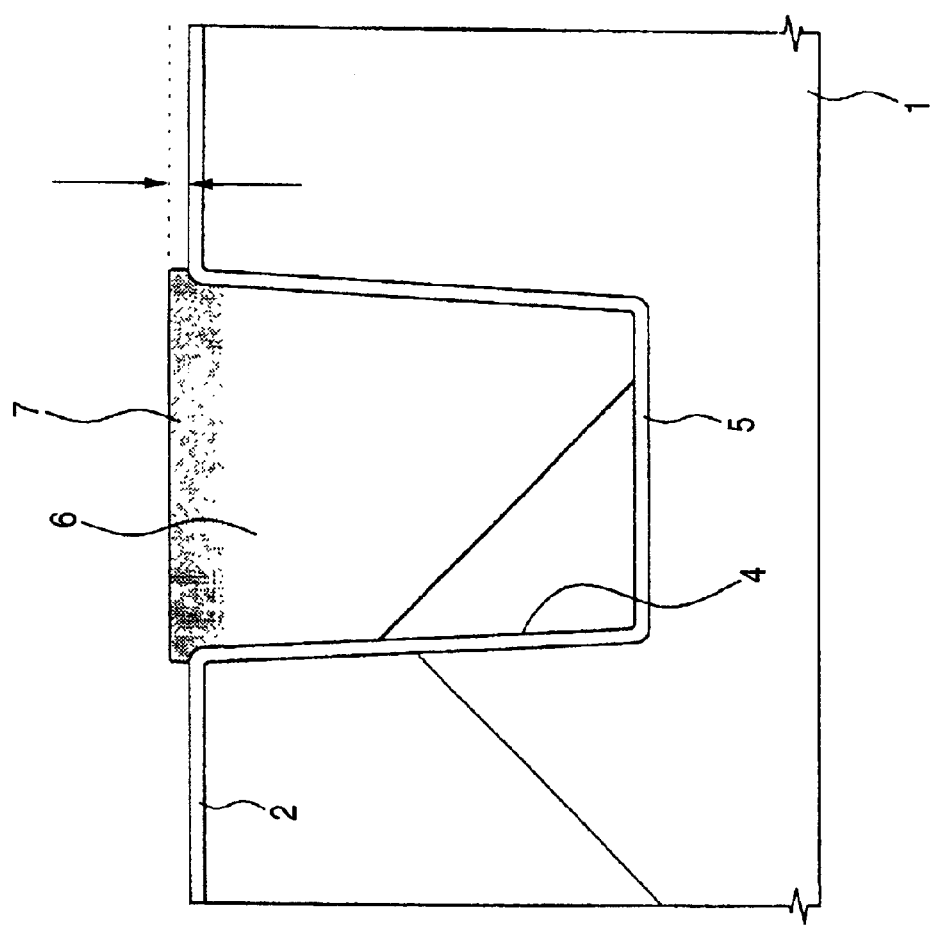
FIG. 13 is an enlarged cross-sectional diagram of a main part of the semiconductor substrate showing a step of the semiconductor integrated circuit device fabrication method in accordance with the embodiment of the invention.

Next, as shown in FIG. 12, using hot phosphoric acid, the silicon nitride film 3 that covers the portions of the substrate 1 in the active regions is removed. With the processes up to here, circuit element isolation grooves 4 are formed in the substrate 1 at its portions in element isolation regions. Note here that, since the aforesaid nitrogen introduced layer 7, that was formed at the surface portion of the silicon oxide film 6, as buried within each element isolation groove 4, is configured such that a peak concentration point of the nitrogen doped by ion implantation is present at a deeper level than the surface, a ratio of the Si—O bond is relatively high at locations adjacent to its surface, whereas a ratio of the Si—N bonds is relatively high in the inside thereof. Due to this, the nitrogen introduce layer 7 is little etched during etching of the silicon nitride film 3 by hot phosphoric acid; thus, as shown in FIG. 13, a stair-step like surface difference that is substantially equivalent to the thickness of the silicon nitride film 3 takes place between a surface portion of the substrate 1 in the individual active region and the surface of the nitrogen introduced layer 7 immediately after removal of the silicon nitride film 3.

Figure 14:
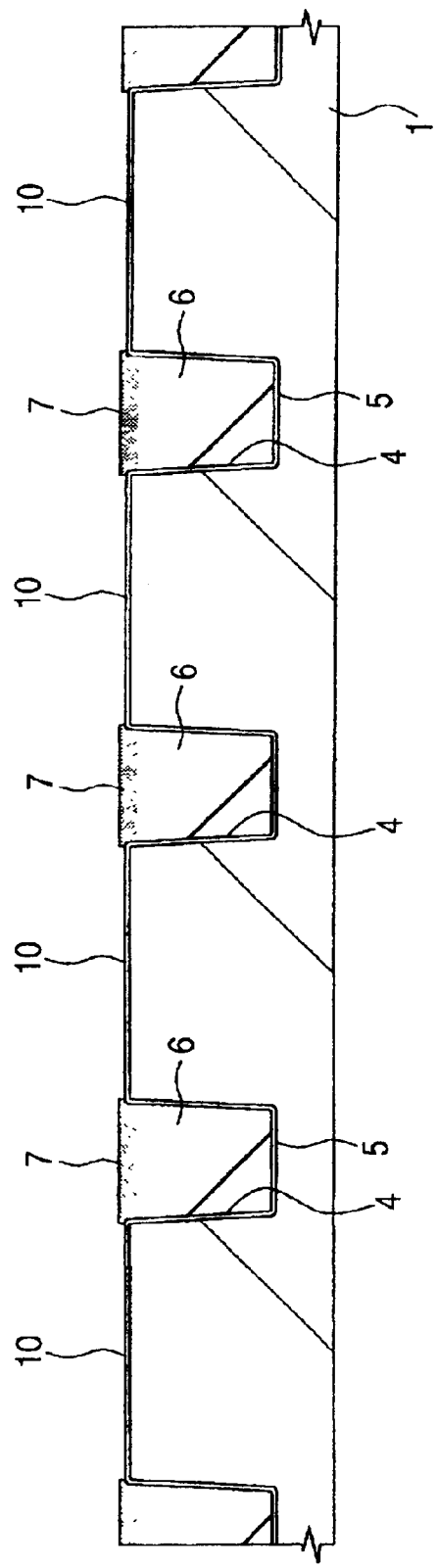
FIG. 14 is a cross-sectional diagram of a main part of the semiconductor substrate showing a step of the semiconductor integrated circuit device fabrication method in accordance with the embodiment of the invention.

Next, after having removed portions of the silicon oxide film 2 exposed to the surface of the substrate 1 in the active regions by use of hydrofluoric acid-based etching liquid (hydrofluoric acid or hydrofluoric acid buffer solution), the substrate 1 is thermally oxidized at about 850° C. to thereby form a thin silicon oxide film 10 with a thickness of about 10 nm on the surface portions of substrate 1 in the active regions, as shown in FIG. 14. The silicon oxide film 10 is formed for effecting reduction of damage of substrate 1 otherwise occurring due to impurity ion implantation, as will be carried out at the next process step.

The nitrogen introduced layer 7 having a lower diffusion coefficient relative to an oxidizer is formed at a surface portion of the silicon oxide film 6 as buried within the individual element isolation groove 4. With such an arrangement, the oxidizer in gas phase (oxygen, water and the like) is prevented from diffusing into the silicon oxide film 6 during the thermal processing step for fabrication of the above-stated silicon oxide film 10, which in turn makes it possible to suppress oxidation of the inner walls of element isolation groove 4.

Note that, although upon removal of the silicon oxide film 2 on the surface portions of the substrate 1 in the active regions by use of a hydrofluoric acid-based etchant, the nitrogen introduced layer 7 partially containing Si—O bonds is also little etched, resulting in a decrease in steplike surface difference between a surface portion of the substrate 1 in an active region and the surface of the nitrogen introduced layer 7. Also, the nitrogen introduced layer 7, which is lower than silicon oxides in etching rate relative to hydrofluoric acid, will hardly be overetched, thereby enabling suppression of defects as to downward retrogradation (recessing) of the silicon oxide film 6 at the edges of the element isolation grooves 4.

Figure 15:
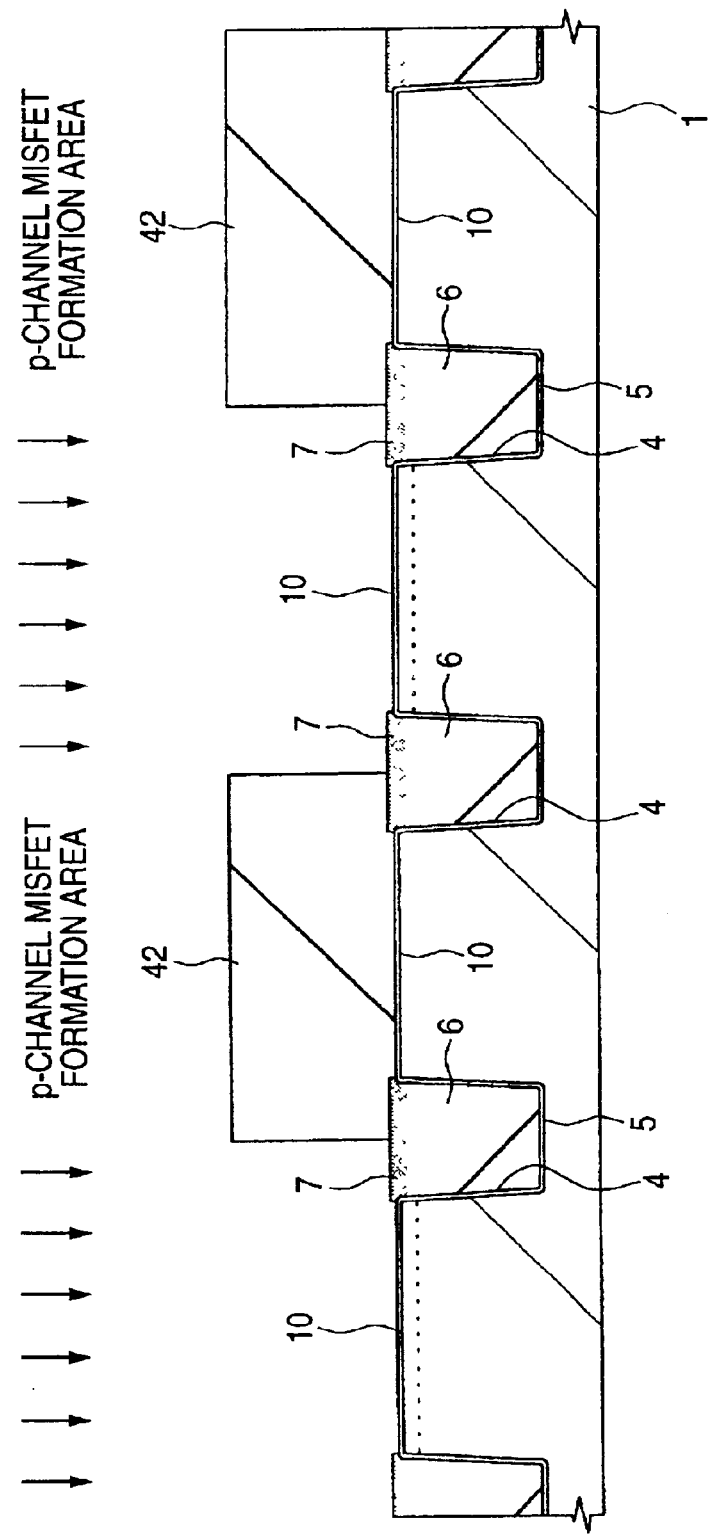
FIG. 15 is a cross-sectional diagram of a main part of the semiconductor substrate showing a step of the semiconductor integrated circuit device fabrication method in accordance with the embodiment of the invention.
Figure 16:
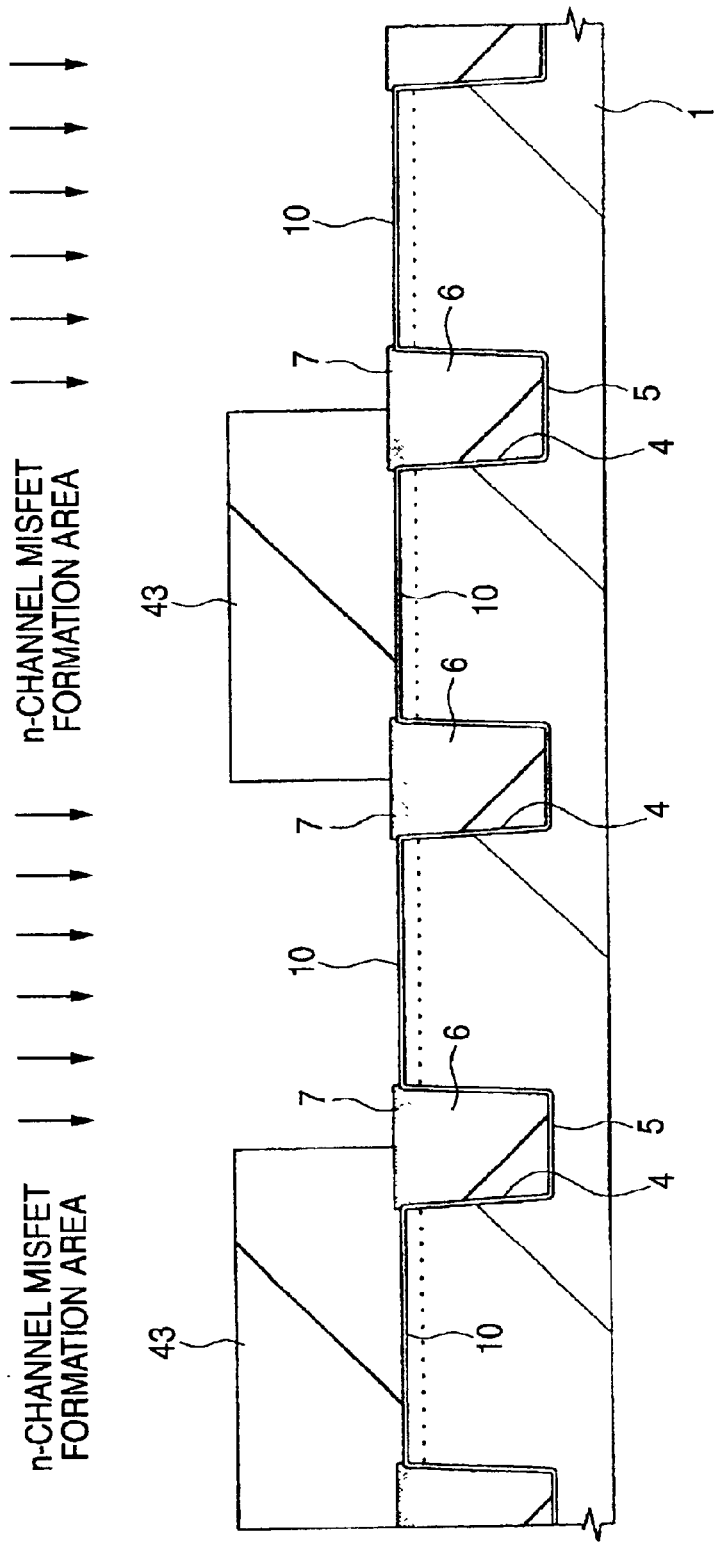
FIG. 16 is a cross-sectional diagram of a main part of the semiconductor substrate showing a step of the semiconductor integrated circuit device fabrication method in accordance with the embodiment of the invention.

Next, as shown in FIG. 15, boron is doped by ion implantation into the surface portions of the substrate 1 in specified areas for fabrication of n-channel type MISFETs, while covering or masking the remaining surface portions of substrate 1 in p-channel MISFET fabrication areas using a photoresist film 42. Subsequently, as shown in FIG. 16, after removal of the photoresist film 42, phosphor is ion-implanted into the surface portions of the substrate 1 in the p-channel MISFET fabrication areas, while letting the surface portions of the substrate 1 in the n-channel MISFET formation areas be covered with a photoresist film 43.

Figure 17:
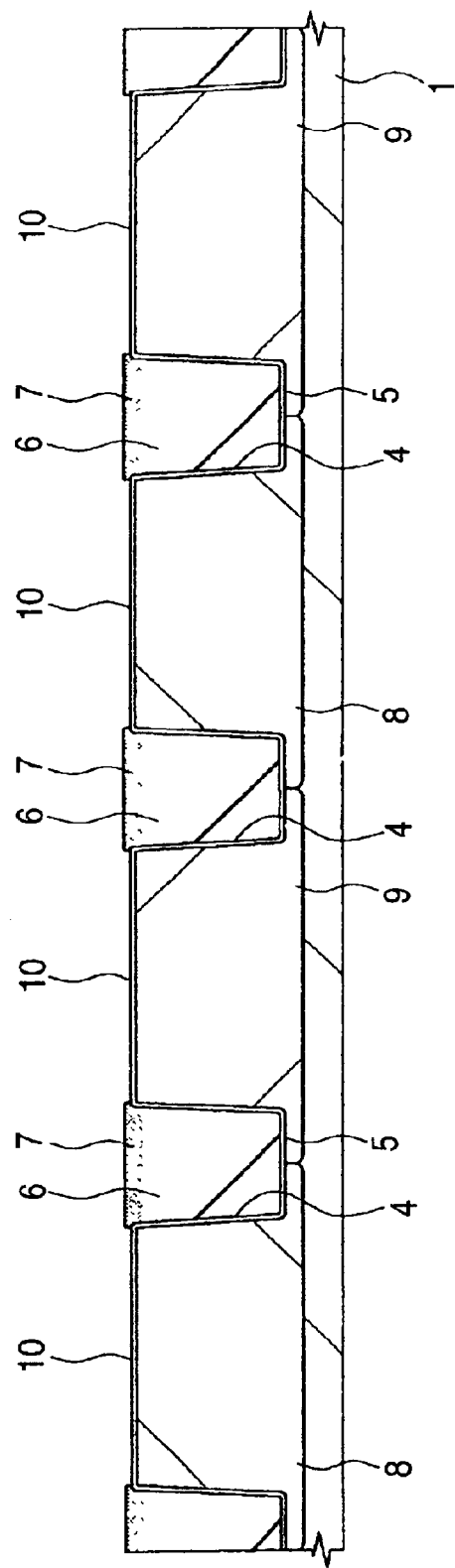
FIG. 17 is a cross-sectional diagram of a main part of the semiconductor substrate showing a step of the semiconductor integrated circuit device fabrication method in accordance with the embodiment of the invention.
Figure 18:
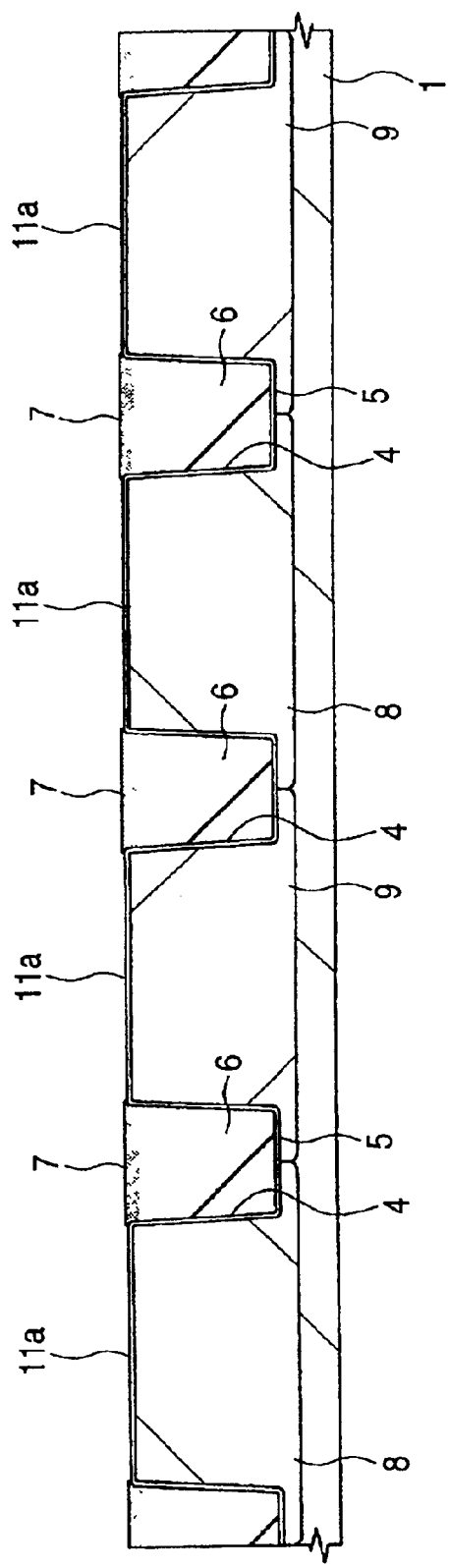
FIG. 18 is a cross-sectional diagram of a main part of the semiconductor substrate showing a step of the semiconductor integrated circuit device fabrication method in accordance with the embodiment of the invention.

Next, as shown in FIG. 17, after having removed the photoresist film 43, the substrate 1 is thermally process d, causing the boron and phosphor dopants introduced into the substrate 1 to diffuse toward the inside of the substrate 1, whereby a semiconductor well region 8 of p type conductivity is formed in the substrate 1 in a respective area for fabrication of an n-channel MISFET, while forming an n-type well 9 in each p-channel MISFET formation area of the substrate 1.

Next, two kinds of transistor gate insulating films, that are different in thickness from each other, are formed on the surface of a respective one of the p-type well 8 and n-well 9, by using the following method. Firstly, after having removed portions of the silicon oxide film 10 overlying respective surfaces of p- and n-wells 8, 9 by hydrofluoric acid-based etchant, the substrate 1 is thermally processed at about 800° C. to thereby form a thin silicon oxide film 11a to a thickness of about 7 to 8 nm on the surface of a respective one of the p- and n-wells 8, 9. This silicon oxide film 11a is provided for use as part of a gate insulating film having an increased thickness.

In view of the fact that the nitrogen introduced layer 7 is formed at the surface portion of the silicon oxide film 6, buried within each element isolation groove 4, it is possible to suppress oxidation of the inner walls of the element isolation groove 4 during thermal processing for fabrication of the above-noted silicon oxide film 11a. Additionally, upon removal of the silicon oxide film 10 using a hydrofluoric acid-based etchant, the surface of nitrogen introduced layer 7 also is slightly etched resulting in a further decrease in the step-like difference between the surface of the substrate 1 in each active region and the surface of the nitrogen introduced layer 7; however, as the nitrogen introduce layer 7 will rarely be overetched, it is possible to suppress any recessing of the edges of the element isolation groove 4.

Figure 19:
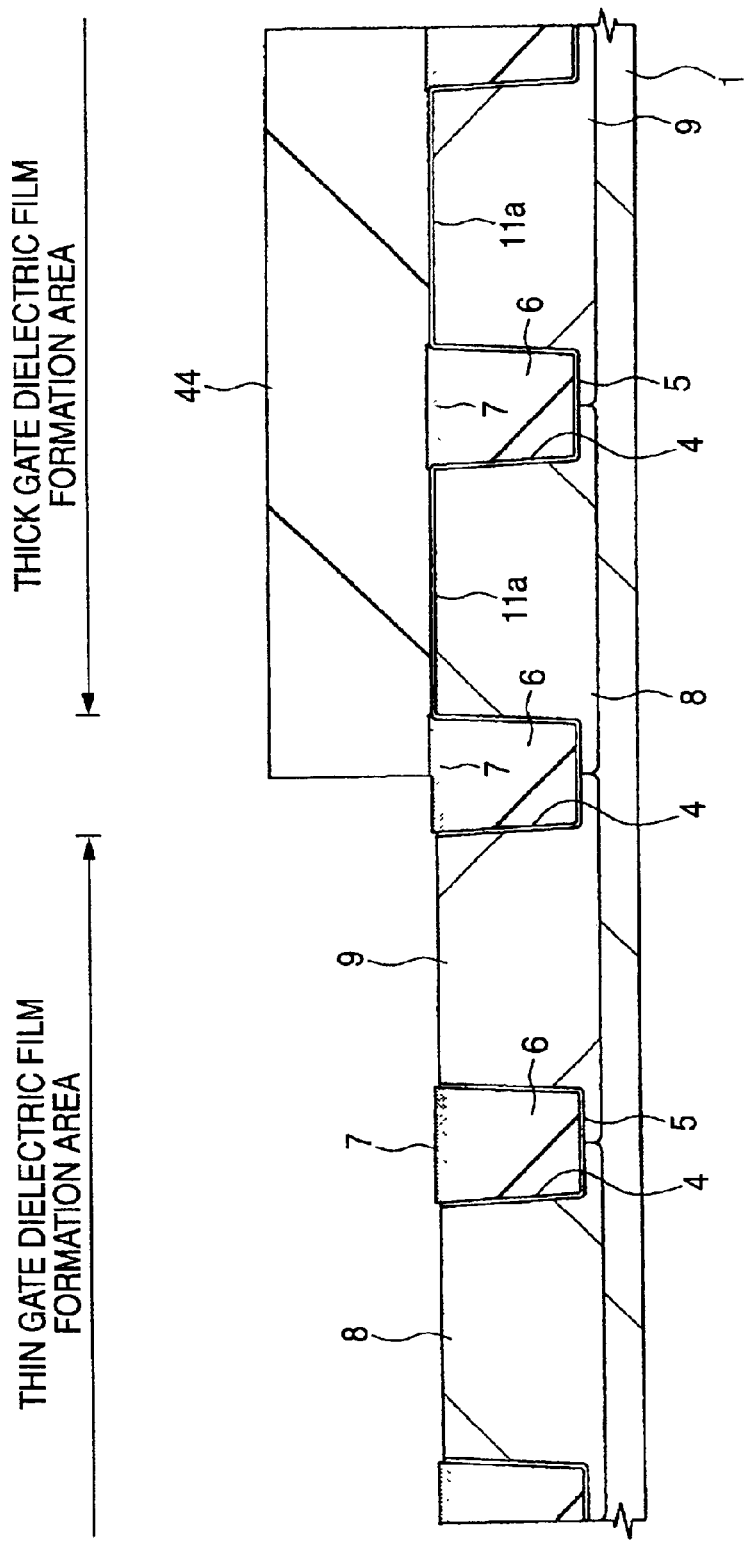
FIG. 19 is a cross-sectional diagram of a main part of the semiconductor substrate showing a step of the semiconductor integrated circuit device fabrication method in accordance with the embodiment of the invention.

Next, as shown in FIG. 19, a photoresist film 44 is formed so as to cover the respective surfaces of the p-type well 8 and the n-type well 9 in the thick gate insulating film fabrication area; and, then, a hydrofluoric acid-based etchant is used to remove the silicon oxide film 11a that has been formed on the surface of a respective one of the p- and n-wells 8, 9 in the thin gate insulating film fabrication area.

Figure 20:
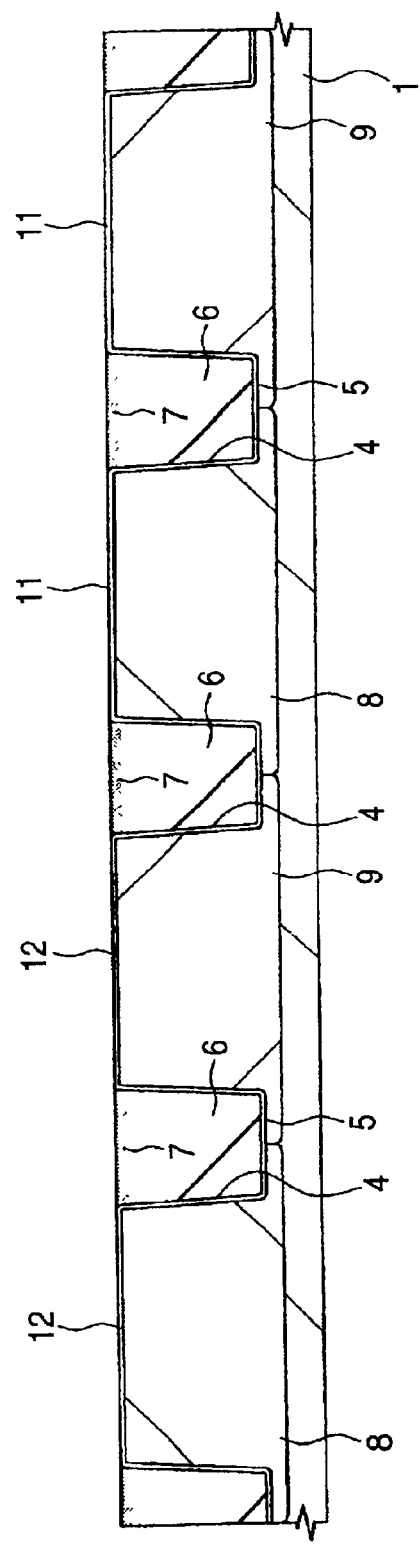
FIG. 20 is a cross-sectional diagram of a main part of the semiconductor substrate showing a step of the semiconductor integrated circuit device fabrication method in accordance with the embodiment of the invention.

Next, after removal of the photoresist film 44, followed by the cleaning of both the surfaces of the p- and n-wells 8, 9 in the thin gate insulating film fabrication area and the surface portions of the silicon oxide film 11a in the thick gate insulating film formation area using a hydrofluoric acid-based cleaning liquid, the substrate 1 is thermally processed at about 800° C. As a result, as shown in FIG. 20, a gate insulating film 12 made of silicon oxide with a thickness of about 5 to 6 nm is formed on the surface of a respective one of the p- and n-wells 8, 9 in the thin gate insulating film fabrication area. In addition, as the silicon oxide film 11a in the thick gate insulating film formation region further increases in thickness, a gate insulating film 11 made of about 10-nm thick silicon oxide is formed on the surface of a respective one of the p- and n-wells 8, 9 in this area.

Since the nitrogen introduced layer 7 is formed at the surface portion of the silicon oxide film 6 buried within each element isolation groove 4, it is possible to suppress oxidation of the inner walls of element isolation groove 4 during thermal processing for formation of the gate insulating films 11, 12 described above. Additionally, upon removal of the silicon oxide film 11a by use of a hydrofluoric acid-based etchant, the surface of the nitrogen introduced layer 7 also is etched very little, resulting in a further decrease in the step-like difference between the surface of substrate 1 in an active region and the surface of the nitrogen introduced layer 7; however, the nitrogen introduced layer 7 will rarely be overetched. Thus, it becomes possible to suppress any recessing at the edges of the element isolation groove 4.

Figure 21:
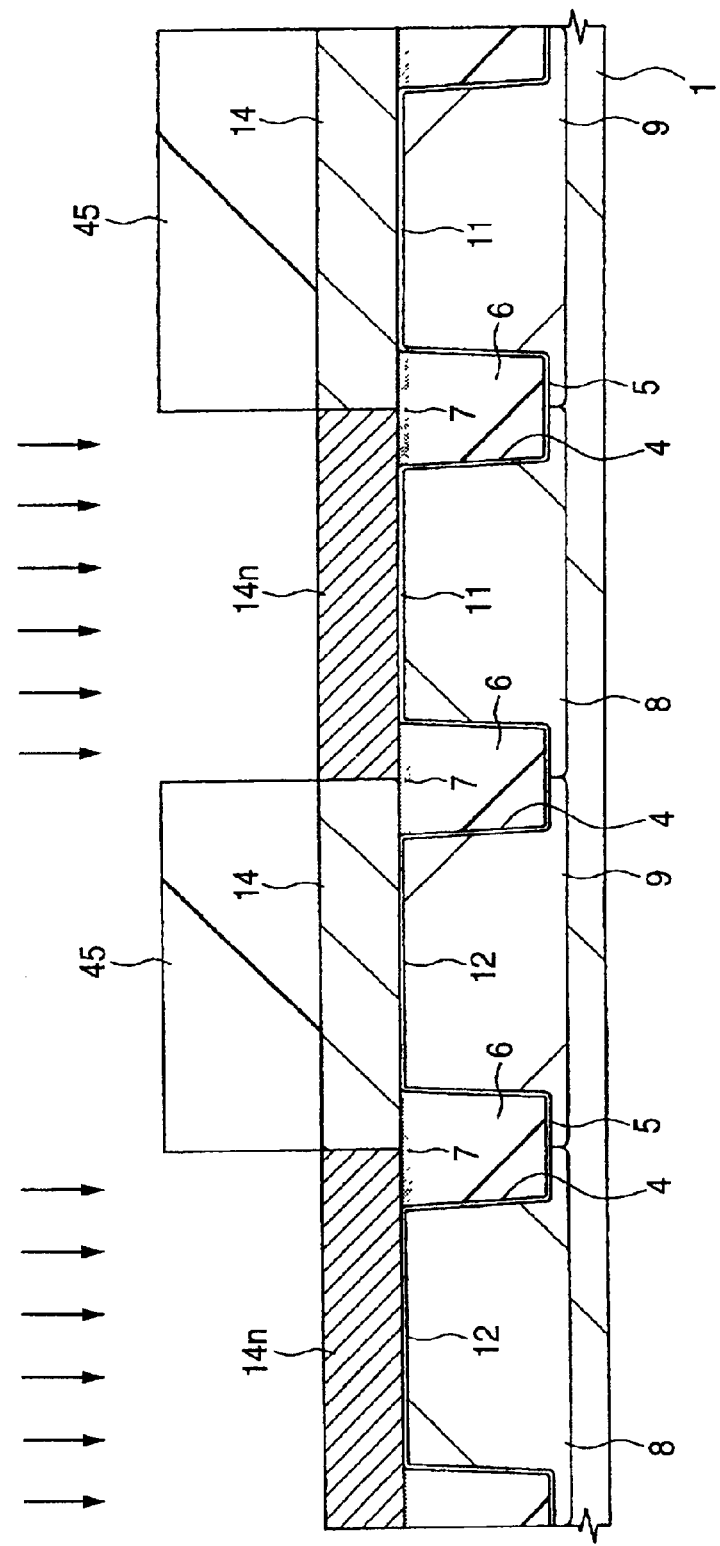
FIG. 21 is a cross-sectional diagram of a main part of the semiconductor substrate showing a step of the semiconductor integrated circuit device fabrication method in accordance with the embodiment of the invention.

Next, as shown in FIG. 21, after having deposited a polycrystalline silicon or "poly-silicon" film 14 over the substrate 1 by CVD methods, a portion of the polysilicon film 14 overlying the individual n-type well 9 is covered or coated with a photoresist film 45; and then, phosphor is ion-implanted into a portion of the polysilicon film 14 overlying each p-type well 8, thereby forming an n-type polysilicon film 14 over the p-well 8.

Figure 22:
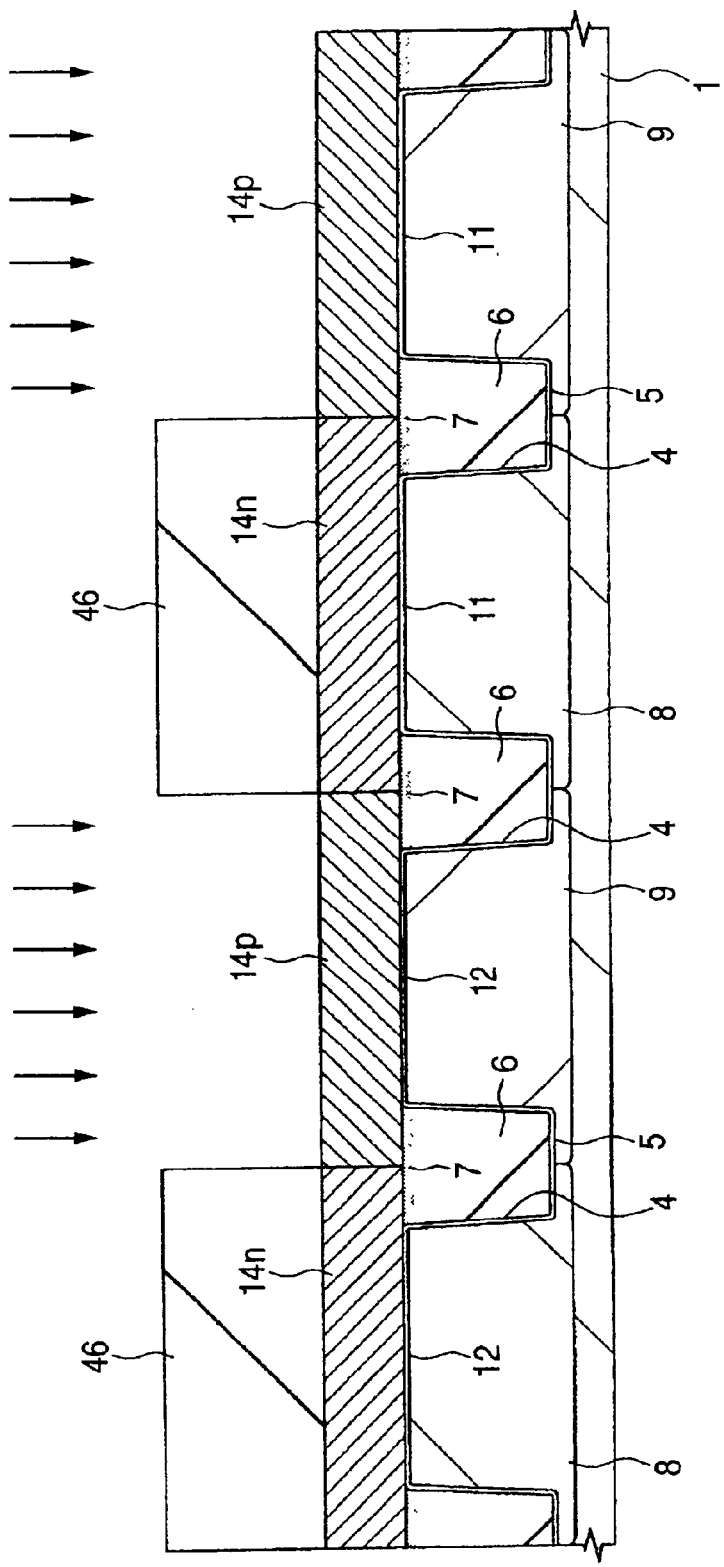
FIG. 22 is a cross-sectional diagram of a main part of the semiconductor substrate showing a step of the semiconductor integrated circuit device fabrication method in accordance with the embodiment of the invention.

Next, as shown in FIG. 22, after removal of the photoresist film 45, a portion of the n-type polysilicon film 14n overlying the n-type well 8 is coated with a photoresist film 46; and then, boron is ion-implanted into a portion of the polysilicon film 14 overlying the n-type well 9, thus forming a p-type polysilicon film 14p over each n-well 9. The n-type polysilicon film 14n and the p-type polysilicon film 14p are provided for later use as MISFET gate electrode material.

Figure 23:
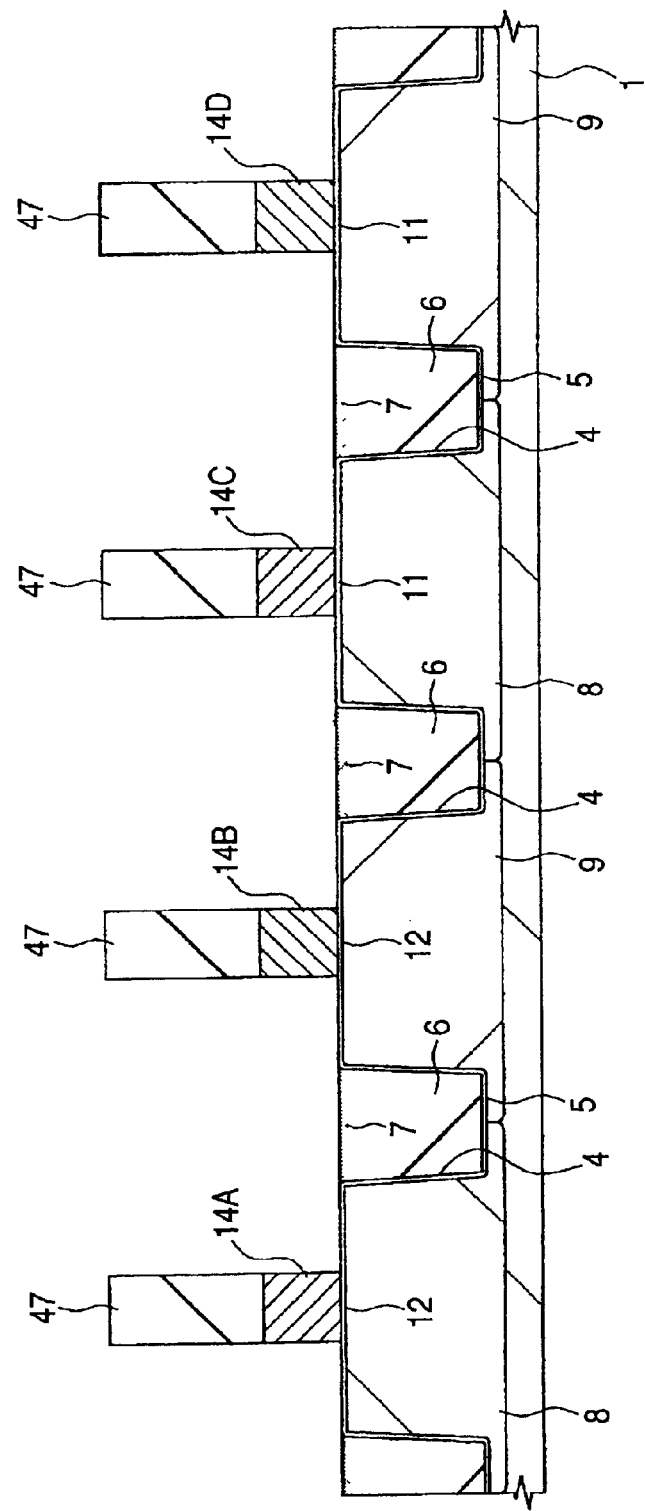
FIG. 23 is a cross-sectional diagram of a main part of the semiconductor substrate showing a step of the semiconductor integrated circuit device fabrication method in accordance with the embodiment of the invention.

Next, as shown in FIG. 23, after having removed the photoresist film 48, the n- and p-type polysilicon films 14n, 14p are dry-etched while using those portions of the photoresist film 47 that are formed over these films 14n, 14p as masks, respectively, thereby to form gate electrodes 14A, 14B, 14C and 14D.

Next, after having removed the photoresist film 47 overlying the gate electrodes 14A–14D by ashing processing, the surface of substrate 1 is cleaned using a hydrofluoric acid-based etchant in order to etch away resultant dry-etch and ash residues which are left thereon. Performing dry etching and cleaning, using a hydrofluoric acid-based etchant, on the n-type polysilicon film 14a and p-type polysilicon film 14p results in portions of the gate insulating films 11,12 in areas other than those underlying the gate electrodes 14A–D being thinned, while, at the same time, allowing portions of the gate insulating films 11,12 at a lower part of the sidewalls of the gate electrodes 14A–D also to be isotropically etched away, thereby causing creation of undercuts, with the result that gate insulating films 11,12 may have a decreased breakdown voltage. To avoid this, the substrate 1 is thermally oxidized for recovery or "regeneration" of gate insulating films 11,12 that are thinned by the above-referenced etching processes (dry etching and wet etching).

At this time also, the nitrogen introduced layer 7, as formed at the surface portion of silicon oxide film 6, acts to suppress diffusion of an oxidizer into the silicon oxide film 6 and, thus, enables suppression of oxidation of the inner walls of the element isolation grooves 4. In addition, since the nitrogen introduced layer 7 is no longer overetched by a hydrofluoric acid-based etchant, any unwanted downward retrogradation (recessing) of the silicon oxide film 6 at the edge portions of the element isolation grooves 4 is also suppressed.

Figure 24:
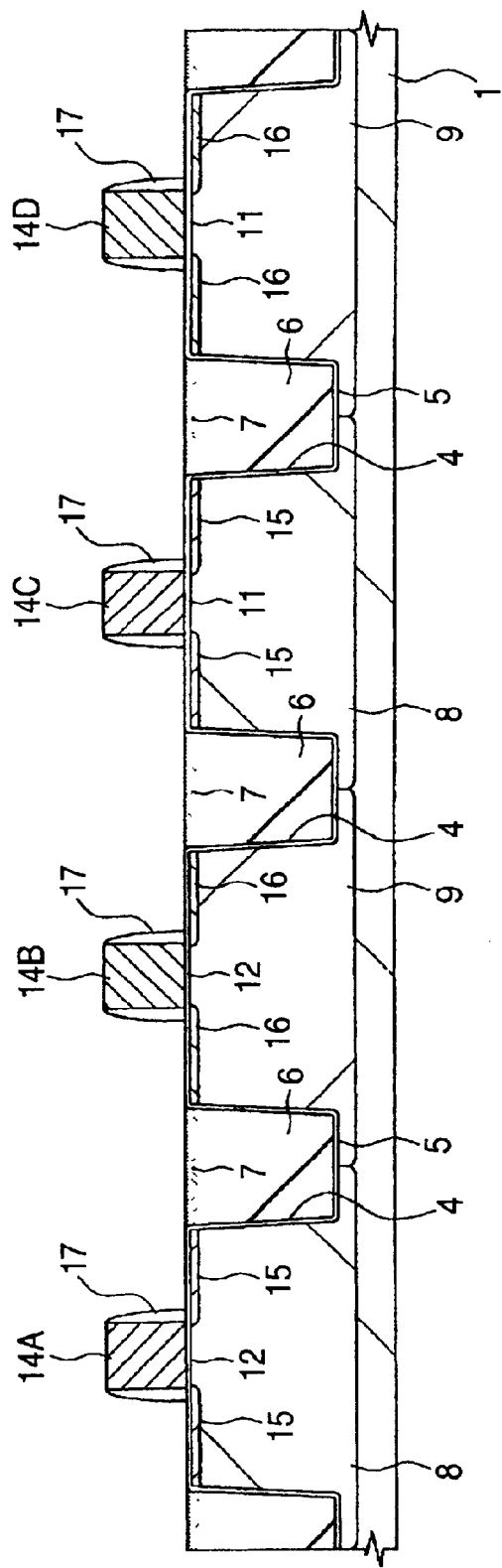
FIG. 24 is a cross-sectional diagram of a main part of the semiconductor substrate showing a step of the semiconductor integrated circuit device fabrication method in accordance with the embodiment of the invention.

Next, as shown in FIG. 24, after having formed lightly-doped n (n⁻) type semiconductor regions 15 in respective ones of the p-type wells 8 at selected surface portions on the opposite sides of gate electrodes 14A, 14C, and having also formed p⁻-type semiconductor regions 16 in each n-type well 9 on both sides of gate electrode 14B, 14D, a silicon oxide film for use as a sidewall spacer 17 is formed on each sidewall of gate electrodes 14A–14D. The n⁻-type semiconductor regions 15 may be formed by arsenic ion implantation into p-type wells 8 while allowing the upper part of each n-type well 9 to be coated with a photoresist film. Similarly, the p⁻-type semiconductor regions 16 are formed by boron ion implantation into the n-wells 9, while allowing the upper part of each p-well 8 to be coated with a photoresist film. The sidewall spacers 17 are formed by applying anisotropic dry etching to a CVD-deposited silicon oxide film over the substrate 1.

Figure 25:
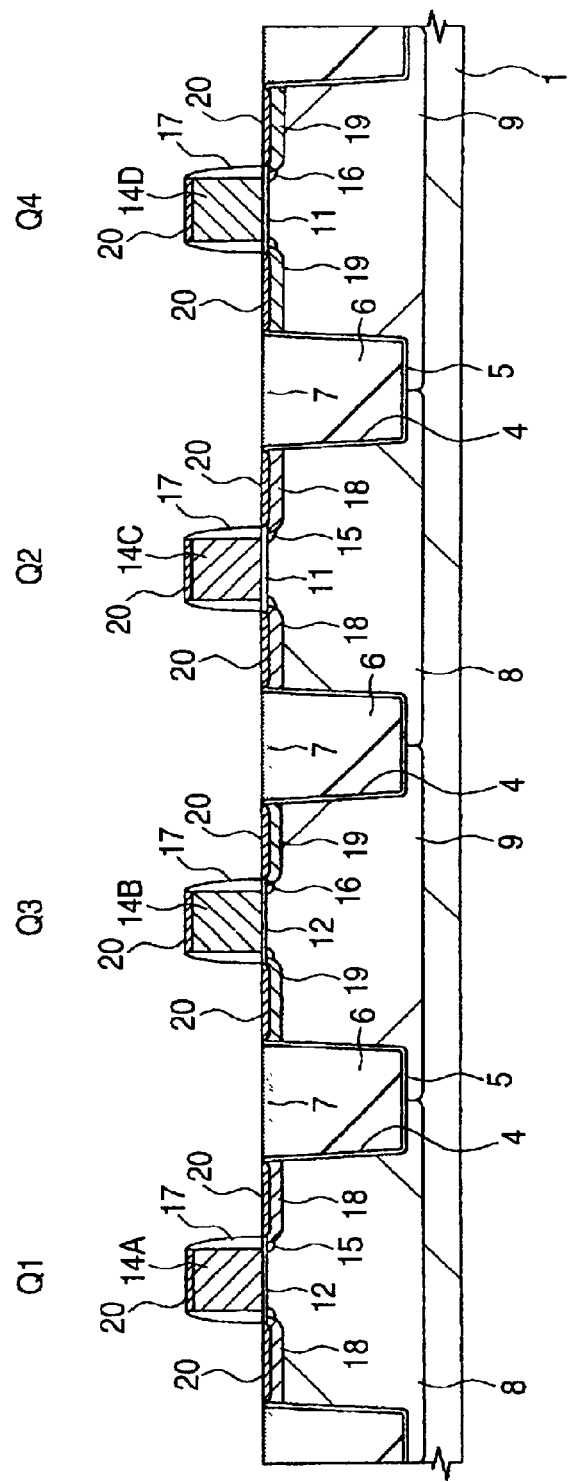
FIG. 25 is a cross-sectional diagram of a main part of the semiconductor substrate showing a step of the semiconductor integrated circuit device fabrication method in accordance with the embodiment of the invention.

Next, as shown in FIG. 25, after having formed heavily-doped n (n⁺) type semiconductor regions 18 (source and drain) in each p-type well 8 at selected surface portions on the opposite sides of gate electrode 14A, 14C, and having also formed p⁺-type semiconductor regions 19 (source, drain) in each n-type well 9 at its surface portions on both sides of gate electrode 14B, 14D, a cobalt (Co) silicide layer 20 is formed in portions overlying gate electrodes 14A–14D and on respective surfaces of the n⁺-type semiconductor regions 18 (source, drain) and p⁺-type semiconductor regions 19 (source, drain), thereby completing n-channel MISFETs Q1 and Q2 and p-channel MISFETs Q3 and Q4. The n⁺-type semiconductor regions 18 are formed by arsenic ion implantation into p-wells 8, while allowing the upper part of each n-well 9 to be covered with a photoresist film. In addition, the p⁺-type semiconductor regions 19 are formed by boron ion implantation into n-wells 9, with the upper part of each p-well 8 being coated with a photoresist film. The cobalt (Co) silicide layer 20 is formed by a process including the steps of using a hydrofluoric acid-based etchant to remove the gate insulating film 11 (or 12) above the surface of a respective one of the n+- and p+-type semiconductor regions 18-19, depositing a Co film over the substrate 1 by sputter techniques, thermally processing the substrate 1, and thereafter removing unreacted portions of the Co film by wet etch methods.

In accordance with the illustrative embodiment, it is possible to effectively suppress any unwanted oxidation of the inner walls of the element isolation grooves 4 during several thermal oxidation process steps to be carried out along the way of the MISFET fabrication process, which in turn makes it possible to reduce the compressive force being applied to certain portions of the substrate 1 in its active regions due to oxidation of the inner walls of the element isolation grooves 4. As a result, crystal defects and/or dislocations that are induced by the compressive force application is suppressed, resulting in suppression of the degradation of device characteristics, such as a current leakage increase; thus, the resultant CMOS devices may improve in reliability and production yield.

In addition, according to this embodiment, it is also possible to avoid the problem of downward recessing of the silicon oxide film 6 at the edges of the element isolation grooves 4 that otherwise tend to occur due to several hydrofluoric acid cleaning processes to be carried out in the fabrication of the MISFETs. This in turn makes it possible to suppress creation of parasitic MOS components that are induced by the recessing phenomenon, resulting in the MISFET characteristics being made stable; thus, the CMOS devices may improve in reliability and manufacturing yield.

Figure 26:
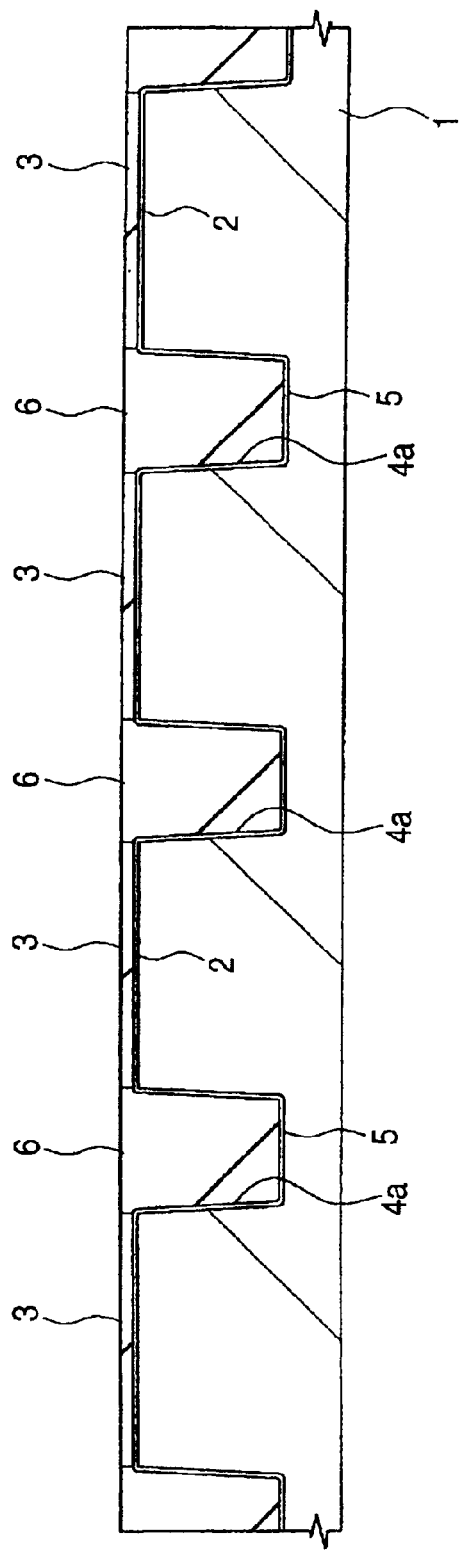
FIG. 26 is a cross-sectional diagram of a main part of a semiconductor substrate showing a step of a semiconductor integrated circuit device fabrication method in accordance with another embodiment of the present invention.

Embodiment 2:

A fabrication method in accordance with a second embodiment of the present invention will be described with reference to FIGS. 26 to 30. Initially, as shown in FIG. 26, after having formed grooves 4a in a substrate 1 by dry etching using a silicon nitride film 3 as a mask, a silicon oxide film 6, that is deposited over the substrate 1, is planarized by CMP techniques. The process steps up to here are similar to those of the aforesaid embodiment described with reference to FIGS. 1 to 7.

Figure 27:
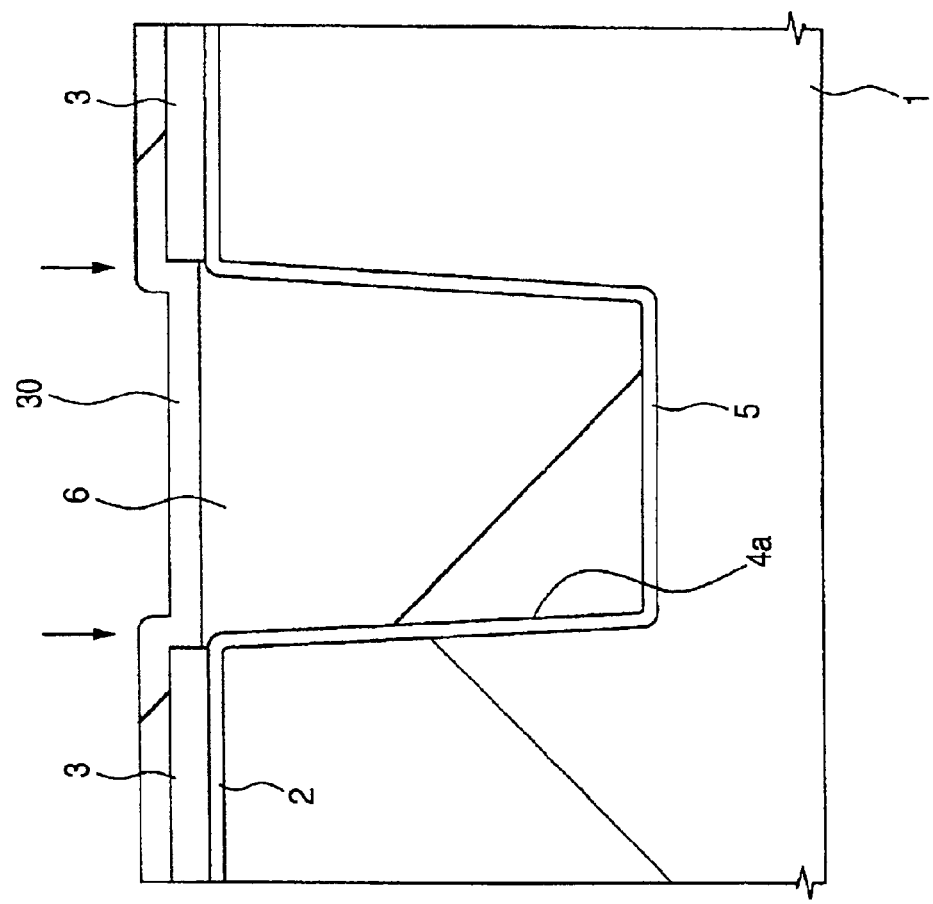
FIG. 27 is an enlarged cross sectional diagram of a main part of the semiconductor substrate showing a step of the semiconductor integrated circuit device fabrication method in accordance with the other embodiment of the invention.

Next, as shown in FIG. 27, after having wet-etched the surface of a portion of the silicon oxide film 6 residing within a groove 4a to thereby retrograde it downwardly, a silicon nitride film 30 is deposited over the substrate 1 by CVD techniques. The silicon nitride film 30 is deposited to a thickness sufficiently less than the diameter of groove 4a.

As shown herein, depositing the silicon nitride film 30 over the substrate 1 in the state that the silicon oxide film 6 is downwardly retrograded, so that it is lower in level than the surface of the silicon nitride film 3 results in the film thickness (thickness at right angles to a principal surface of the substrate 1) of the silicon nitride film 30 at the sidewall portions of the silicon nitride film 3—namely, at the periphery of groove 4a—becoming thicker than the remaining regions.

Figure 28:
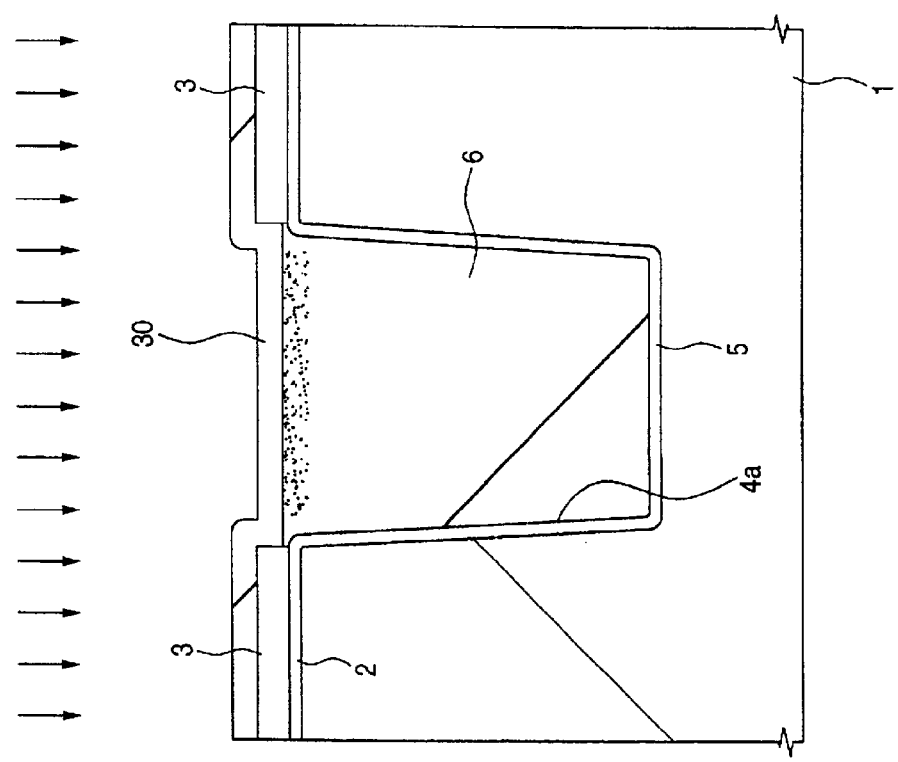
FIG. 28 is an enlarged cross-sectional diagram of a main part of the semiconductor substrate showing a step of the semiconductor integrated circuit device fabrication method in accordance with the other embodiment of the invention.

Next, as shown in FIG. 28, nitrogen is doped by ion implantation into the entire surface area of the substrate 1. At this time, the acceleration energy of nitrogen ions is appropriately controlled in such a way as to prevent the arrival of nitrogen ions at the surface of the substrate 1 in active regions after penetration of the silicon nitride film 3. With such acceleration energy control, nitrogen is hardly introduced into portions of the silicon oxide film 6 underlying the silicon nitride film 3 because of the fact that peripheral portions of the groove 4a are coated with the silicon nitride film 3 of a relatively large thickness.

Figure 29:
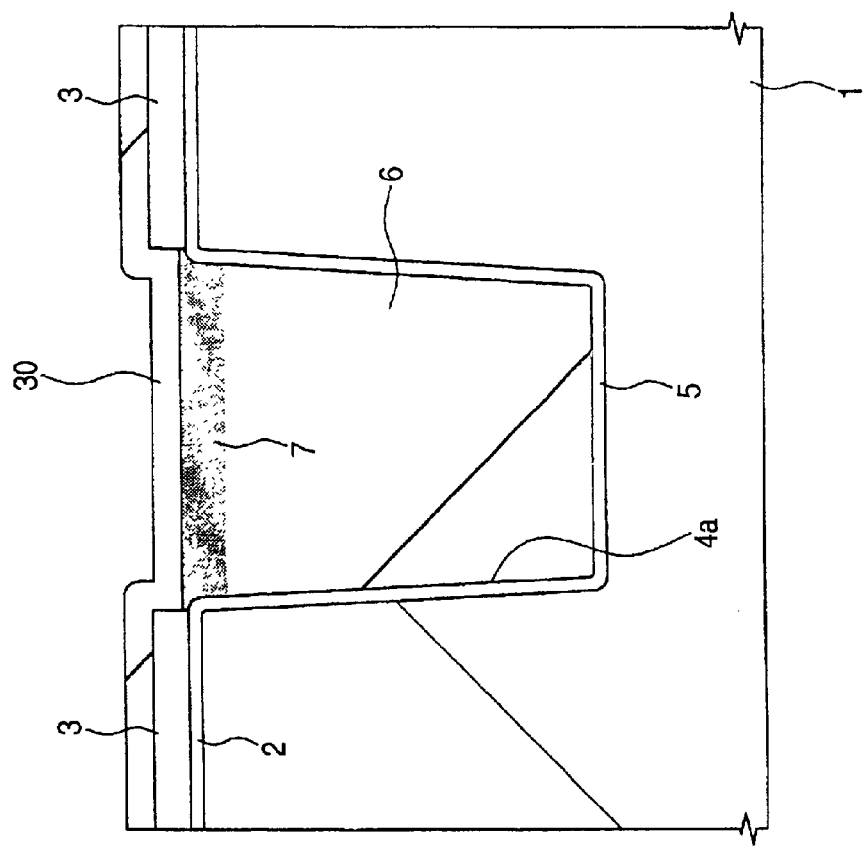
FIG. 29 is an enlarged cross-sectional diagram of a main part of the semiconductor substrate showing a step of the semiconductor integrated circuit device fabrication method in accordance with the other embodiment of the invention.

Next, as shown in FIG. 29, the substrate 1 is subjected to thermal processing for activation of the nitrogen that has been doped, thereby forming a nitrogen introduced layer 7 at a surface portion of the silicon oxide film 6. This nitrogen introduced layer 7 is high in nitrogen concentration at a central portion of groove 4a and becomes lower at portions adjacent to the active regions in the substrate 1.

Figure 30:
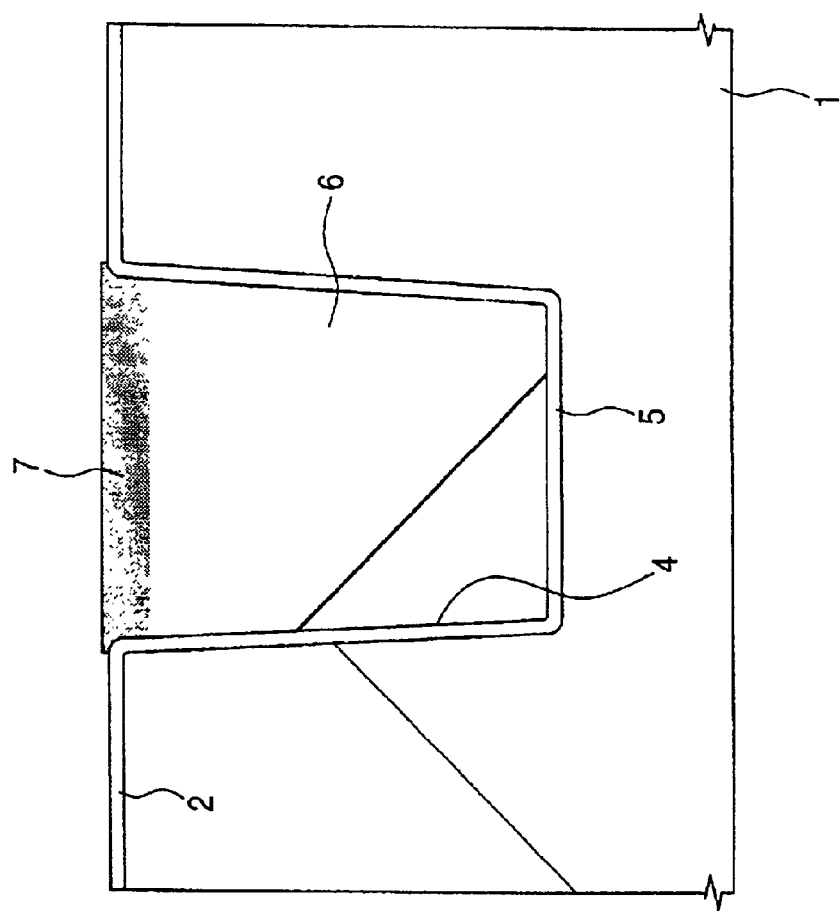
FIG. 30 is an enlarged cross-sectional diagram of a main part of the semiconductor substrate showing a step of the semiconductor integrated circuit device fabrication method in accordance with the other embodiment of the invention.

Next, as shown in FIG. 30, hot hydrofluoric acid is used to remove both the silicon nitride film 30 covering the entire surface of the substrate 1 and the silicon nitride film 3 covering the active regions in the substrate 1, to thereby form a circuit element isolation groove 4 in each element isolation area of the substrate 1. The following process steps are similar in principle to those of the embodiment 1 described above.

In accordance with the embodiment 2, specifically designing the nitrogen concentration of the nitrogen introduced layer 7 so that it stays low at portions adjacent to the active regions in the substrate 1 makes it possible to suppress diffusion of nitrogen residing in the nitrogen introduced layer 7 toward portions of the substrate 1 at active region edges during thermal processing to be later effectuated, which in turn minimizes the risks of occurrence of a reduction in the breakdown voltage of gate insulating films at locations adjacent to active region edges and/or a variation in the threshold voltage of the MISFETs.

Figure 31:
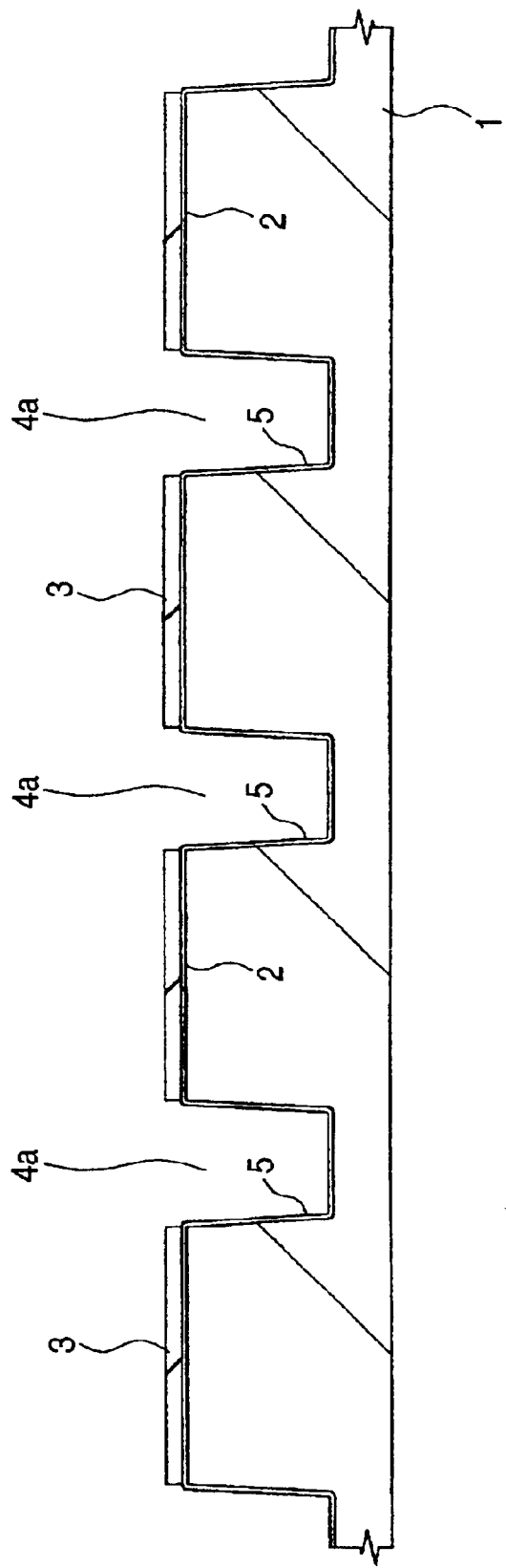
FIG. 31 is a cross-sectional diagram of a main part of a semiconductor substrate showing a step of a semiconductor integrated circuit device fabrication method in accordance with still another embodiment of the invention.

Embodiment 3:

A fabrication method in accordance with a third embodiment of the present invention will be described with reference to FIGS. 31 to 33. First of all, as shown in FIG. 31, after having formed grooves 4a in a substrate 1 by dry etching using a silicon nitride film 3 as a mask, thermal processing is applied to the substrate 1 to thereby form a thin silicon oxide film 5 on the inner walls of each groove 4a. The process steps up to here are similar in principle to those of the previous embodiment described with reference to FIGS. 1 to 4.

Figure 32:
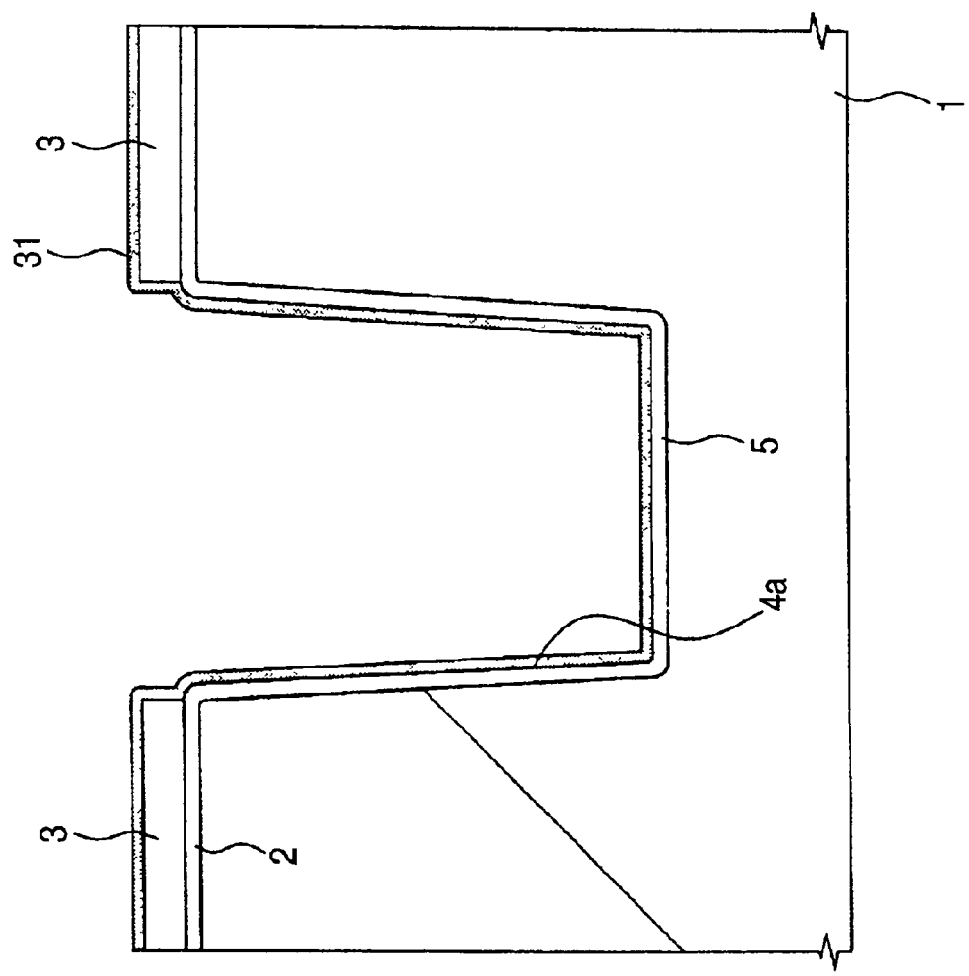
FIG. 32 is an enlarged cross-sectional diagram of a main part of the semiconductor substrate showing a step of the semiconductor integrated circuit device fabrication method in accordance with the still other embodiment of the invention.

Next, as shown in FIG. 32, a CVD technique is used to deposit a thin silicon nitride film 31 over the substrate 1 to a thickness of about 5 to 10 nm.

Figure 33:
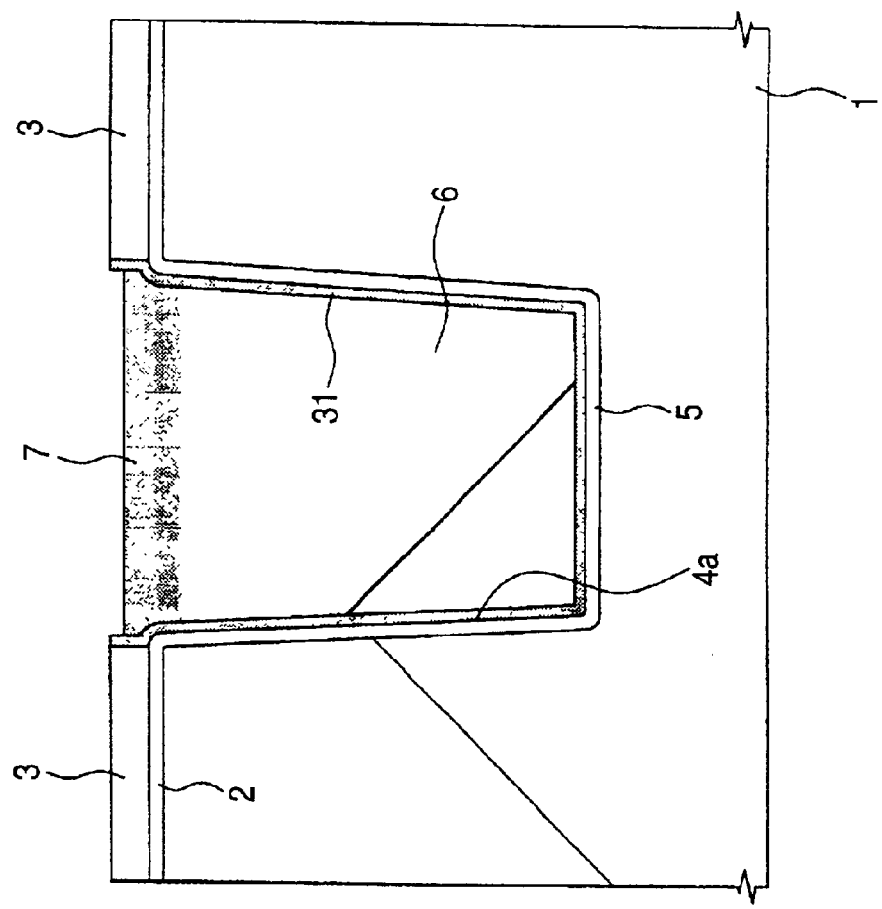
FIG. 33 is an enlarged cross-sectional diagram of a main part of the semiconductor substrate showing a step of the semiconductor integrated circuit device fabrication method in accordance with the still other embodiment of the invention.

Subsequently, as shown in FIG. 33, after having buried a silicon oxide film 6 within the groove 4a by use of a method similar to that of the embodiment 1 and then planarizing its surface, a nitrogen introduced layer 7 is fabricated at a surface portion of the silicon oxide film 6. The following process steps are similar to those of the embodiment 1 described above.

In this way, with the embodiment 3, the silicon nitride film 31 is formed along the inner walls of the element isolation groove 4, while the nitrogen introduced layer 7 is formed at the surface portion of the silicon oxide film 6 buried within the element isolation groove 4; thus, it is possible to effectively suppress oxidation of the inner walls of element isolation groove 4 during thermal oxidation processes.

Figure 34:
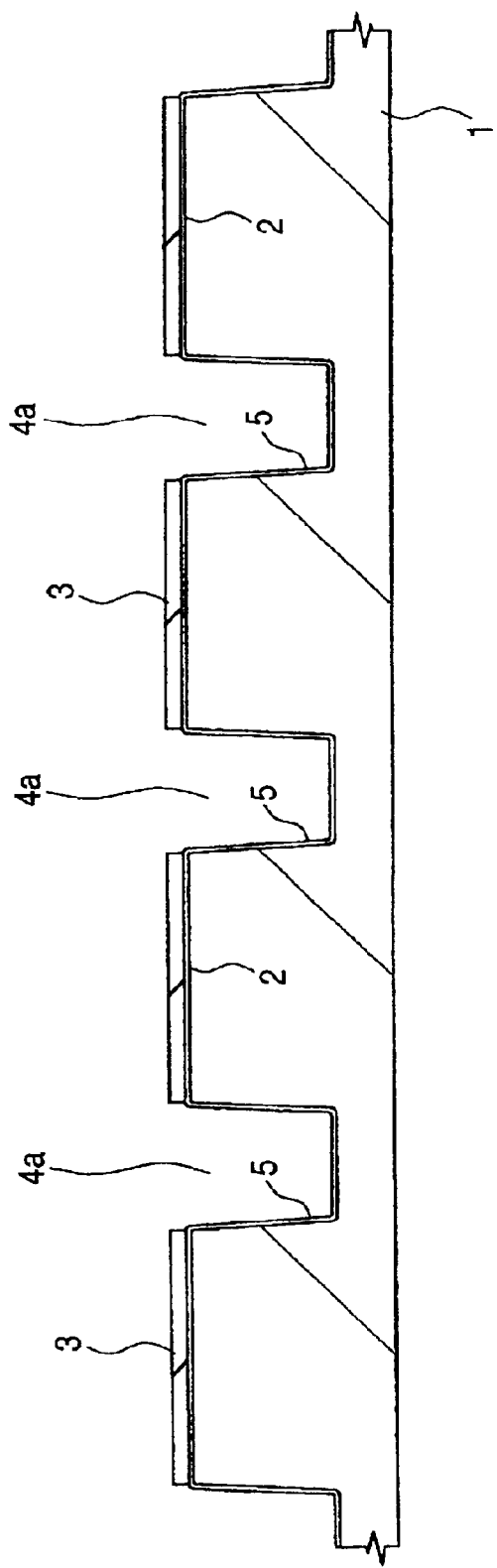
FIG. 34 is a cross-sectional diagram of a main part of a semiconductor substrate showing a step of a semiconductor integrated circuit device fabrication method in accordance with yet another embodiment of the invention.

Embodiment 4:

A fabrication method in accordance with a fourth embodiment will next be described with reference to FIGS. 34 to 36. First, as shown in FIG. 34, after having formed grooves 4a in a substrate 1 by dry etch techniques using a silicon nitride film 3 as a mask, substrate 1 is thermally processed to thereby form a thin silicon oxide film 5 on inner surfaces—namely a bottom surface and sidewalls—of each groove 4a. The process up to here is similar to that of the previous embodiment described with reference to FIGS. 1 to 4.

Figure 35:
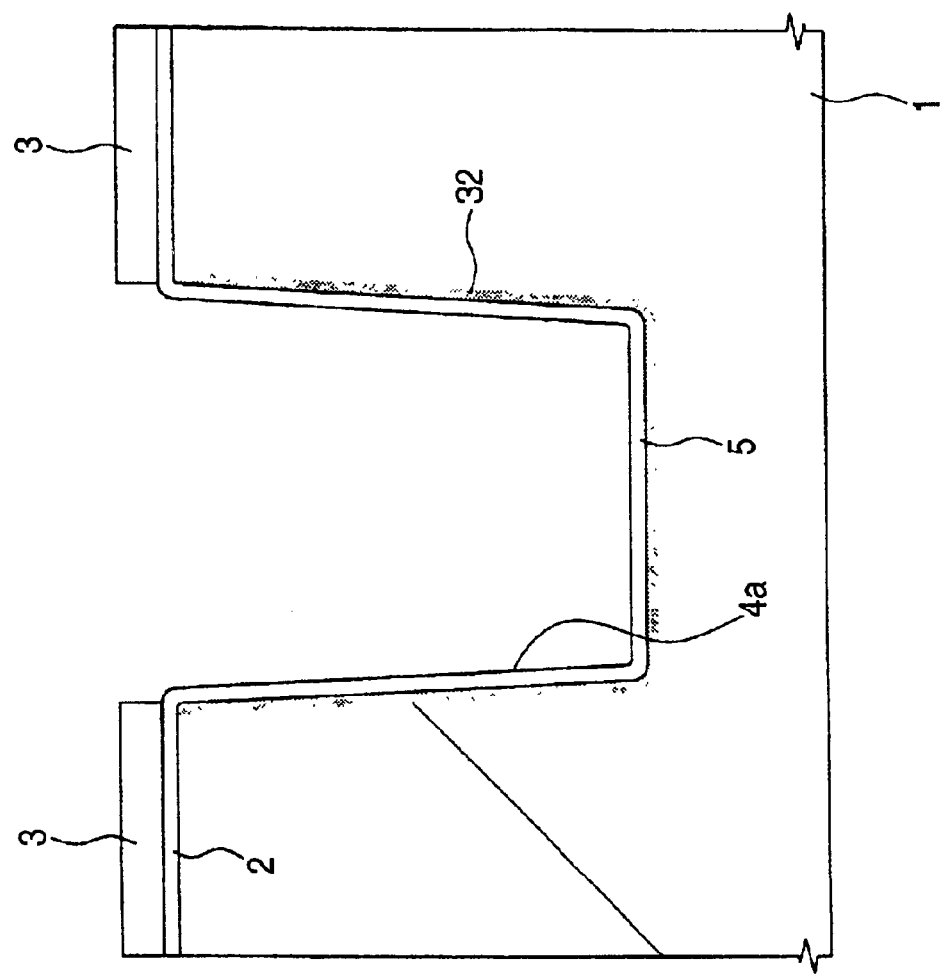
FIG. 35 is an enlarged cross-sectional diagram of a main part of the semiconductor substrate showing a step of the semiconductor integrated circuit device fabrication method in accordance with the yet other embodiment of the invention.

Next, as shown in FIG. 35, a nitrogen containing layer 32 is fabricated on the bottom surface and sidewalls of groove 4a. This nitrogen containing layer 32 is manufacturable by a method which includes the steps of thermally processing the substrate 1 in an environment of a mixture of NO and $N_2$ gas here, 10% of NO contained at temperatures ranging, for example, from 900 to 950° C., and then forcing segregation of the nitrogen into the bottom face and sidewalls of the groove 4a. Alternatively, the nitrogen containing layer 32 may be formed through thermal processing of the substrate 1 in a N$_2$O gaseous atmosphere at 1000 to 1050° C.

Figure 36:
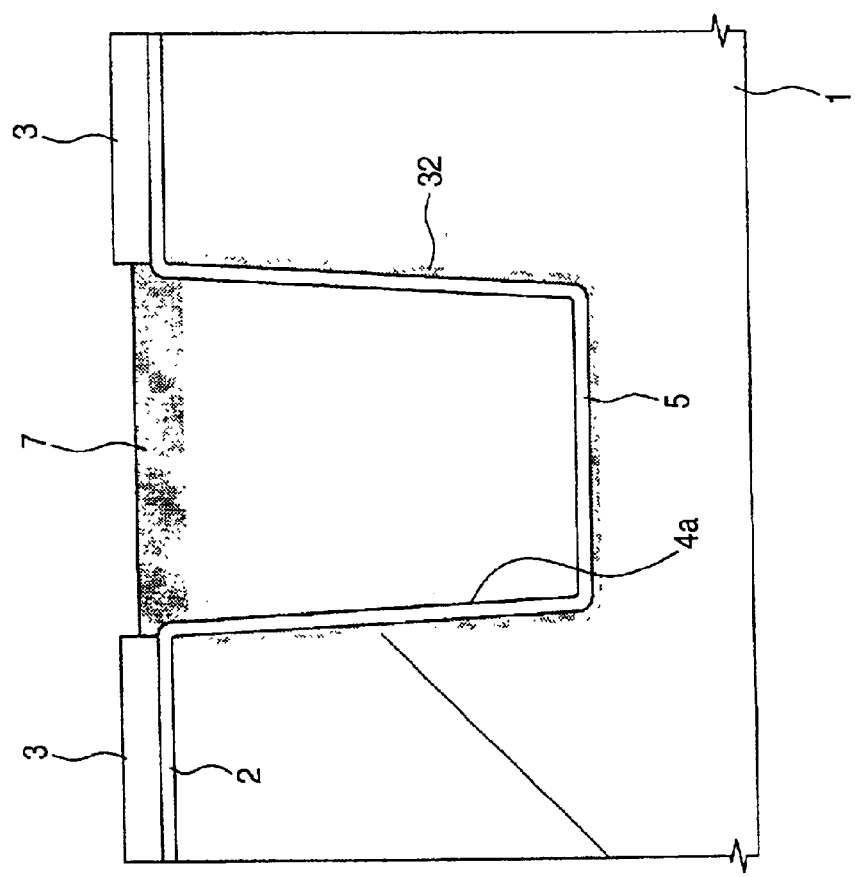
FIG. 36 is an enlarged cross-sectional diagram of a main part of the semiconductor substrate showing a step of the semiconductor integrated circuit device fabrication method in accordance with the yet other embodiment of the invention.

Next, as shown in FIG. 36, after having buried a silicon oxide film 6 within the groove 4a by using a similar method to that of the previous embodiment 1, followed by planarization of the surface thereof, a nitrogen introduced layer 7 is formed at a surface portion of the silicon oxide film 6. Although the nitrogen introduced layer 7 is capable of being formed by the above-noted ion implantation technique, the same results are obtainable by another method, including the step of exposing the substrate 1 to a high-density nitrogen plasma atmosphere. Still another approach is to employ a method including the steps of performing this nitrogen plasma processing, and, thereafter, thermally processing the substrate 1 for to cause outdiffusion of nitrogen within the silicon oxide film 6, to thereby adjust the depth of the nitrogen introduced layer 7 and/or the profile of nitrogen doped region.

In this way, with the embodiment 4, the nitrogen containing layer 32 is formed on the bottom and sidewalls of element isolation groove 4, while simultaneously forming the nitrogen introduced layer 7 at the surface portion of silicon oxide film 6 buried within element isolation groove 4. This nitrogen containing layer 32 is expected to function along with the nitrogen introduced layer 7 as a barrier layer for suppression of diffusion of an oxidizer being used; thus, it becomes possible to effectively suppress oxidation of the inner surfaces of the element isolation groove 4 during thermal oxidation processes.

Figure 37:
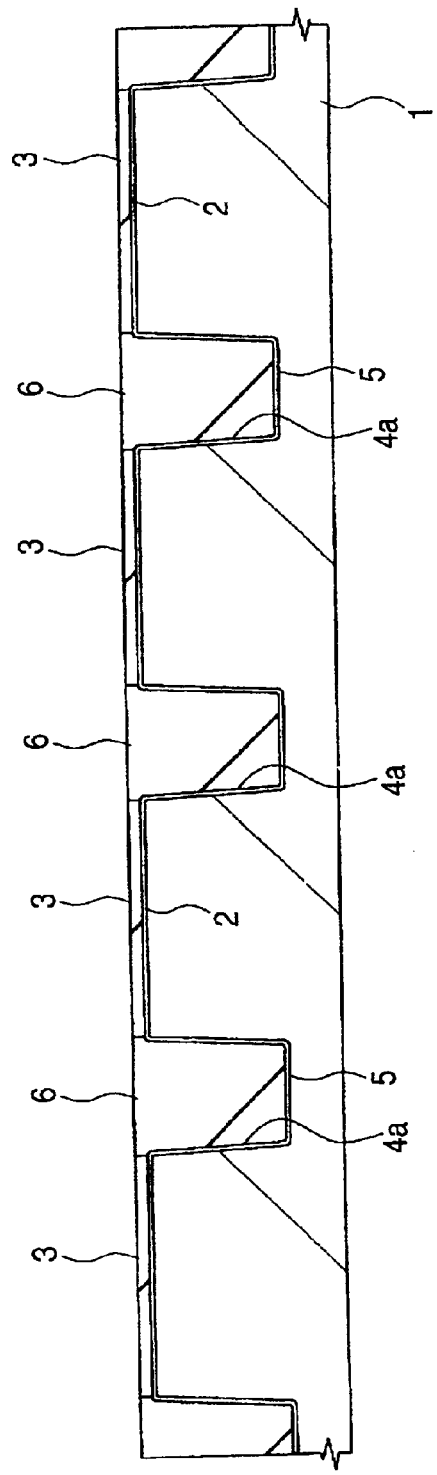
FIG. 37 is a sectional diagram of a main part of a semiconductor substrate showing a step of a semiconductor integrated circuit device fabrication method in accordance with a further embodiment of the instant invention.

Embodiment 5:

A fabrication method in accordance with a fifth embodiment will be discussed with reference to FIGS. 37 to 41. Firstly, as shown in FIG. 37, after having formed grooves 4a in a substrate 1 by dry etching using silicon nitride film 3 as a mask, CMP processing is performed to planarize a silicon oxide film 6 that has been deposited over substrate 1. The process steps up to here are the same as those of the previous embodiment 1 as described with reference to FIGS. 1 to 7.

Figure 38:
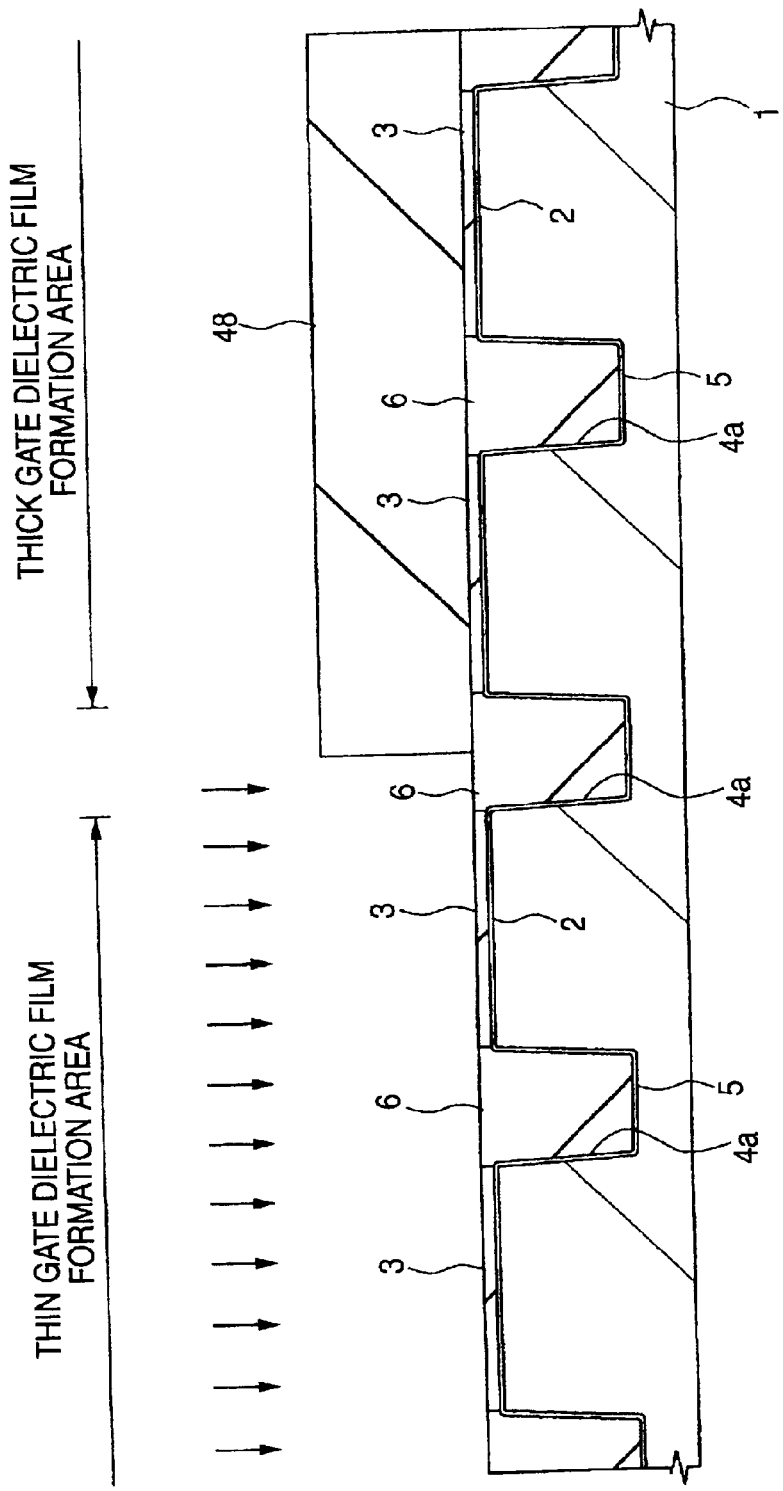
FIG. 38 is a cross-sectional diagram of a main part of the semiconductor substrate showing a step of the semiconductor integrated circuit device fabrication method in accordance with the further embodiment of the invention.

Next, as shown in FIG. 38, a selected portion of the substrate 1, in an area for formation of a thick gate insulating film(s), is coated with a photoresist film 48; and then, by ion implantation, nitrogen is doped into the substrate 1 in another area for fabrication of a thin gate insulating film(s). At this time, the acceleration energy of nitrogen ions is controlled to ensure that the nitrogen ions pass through the silicon nitride film 3 to reach surface portions of the substrate 1 in active regions thereof.

Figure 39:
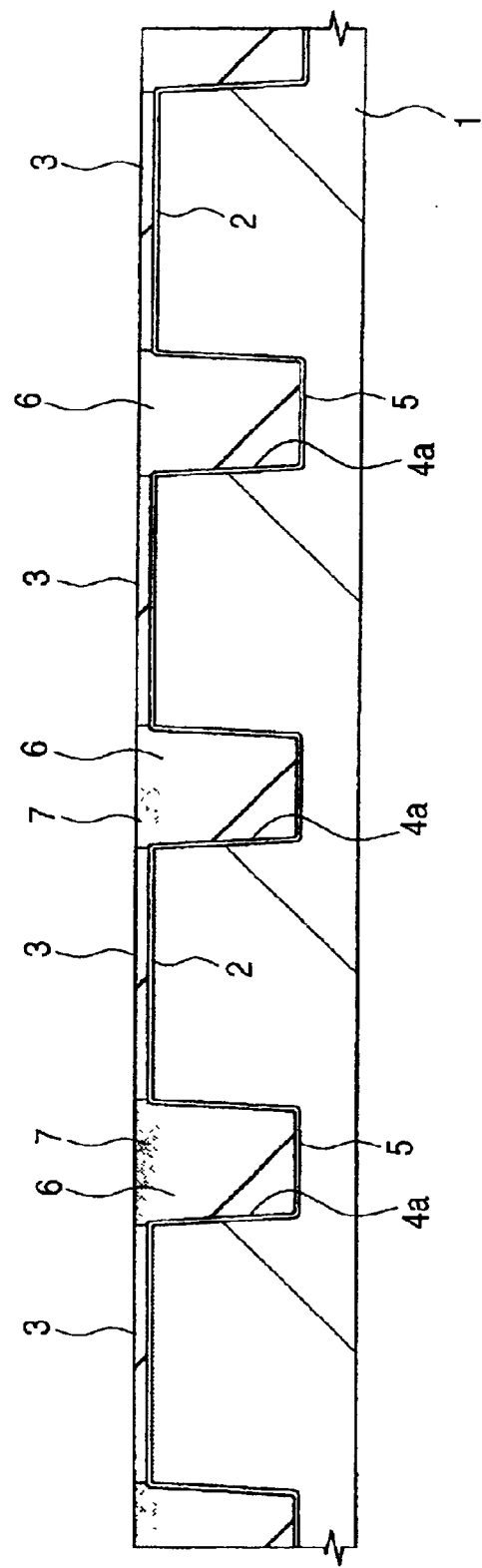
FIG. 39 is a cross-sectional diagram of a main part of the semiconductor substrate showing a step of the semiconductor integrated circuit device fabrication method in accordance with the further embodiment of the invention.

Next, as shown in FIG. 39, after having removed the photoresist film 48, the substrate 1 is thermally processed for activation of the doped nitrogen, to thereby form a nitrogen introduced layer 7 at a surface portion of the silicon oxide film 6 buried within grove 4a in the thin gate insulating film formation area.

Figure 40:
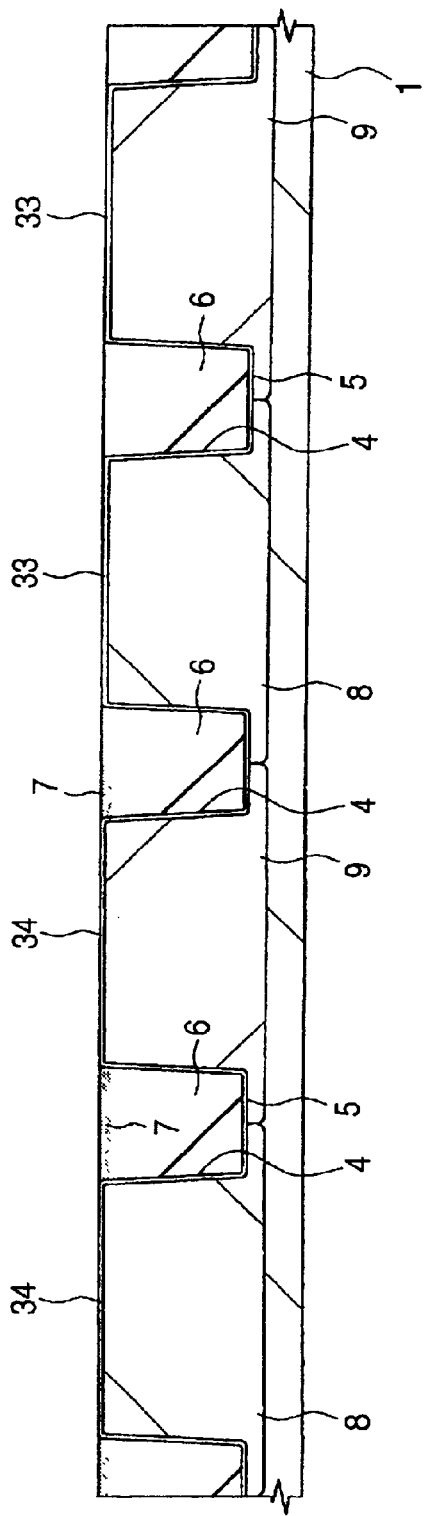
FIG. 40 is a cross-sectional diagram of a main part of the semiconductor substrate showing a step of the semiconductor integrated circuit device fabrication method in accordance with the further embodiment of the invention.

Next, after having performed necessary processing, including removal of the silicon nitride film 3 and formation of wells (p- and n-type wells 8, 9) in accordance with the process steps of the embodiment 1, as shown in FIGS. 12 to 17, the substrate 1 is thermally processed at about 800° C. to form a silicon oxide film 33 for use as a gate insulating film with a thickness of about 10 nm on the surface of a respective one of the p- and n-type wells 8, 9 in the thick gate insulating film formation area, as shown in FIG. 40. Although at this time respective surfaces of the p- and n-type wells 8, 9 in the thin gate insulating film formation area are also oxidized, the oxidation rates stay lower due to the fact that these surfaces have been doped with nitrogen. The result is that a gate insulating film 34 made of silicon oxide (with a thickness of 5 to 6 nm, for example), which is thinner than the above-stated gate insulating film 33, is formed on this surface.

Figure 41:
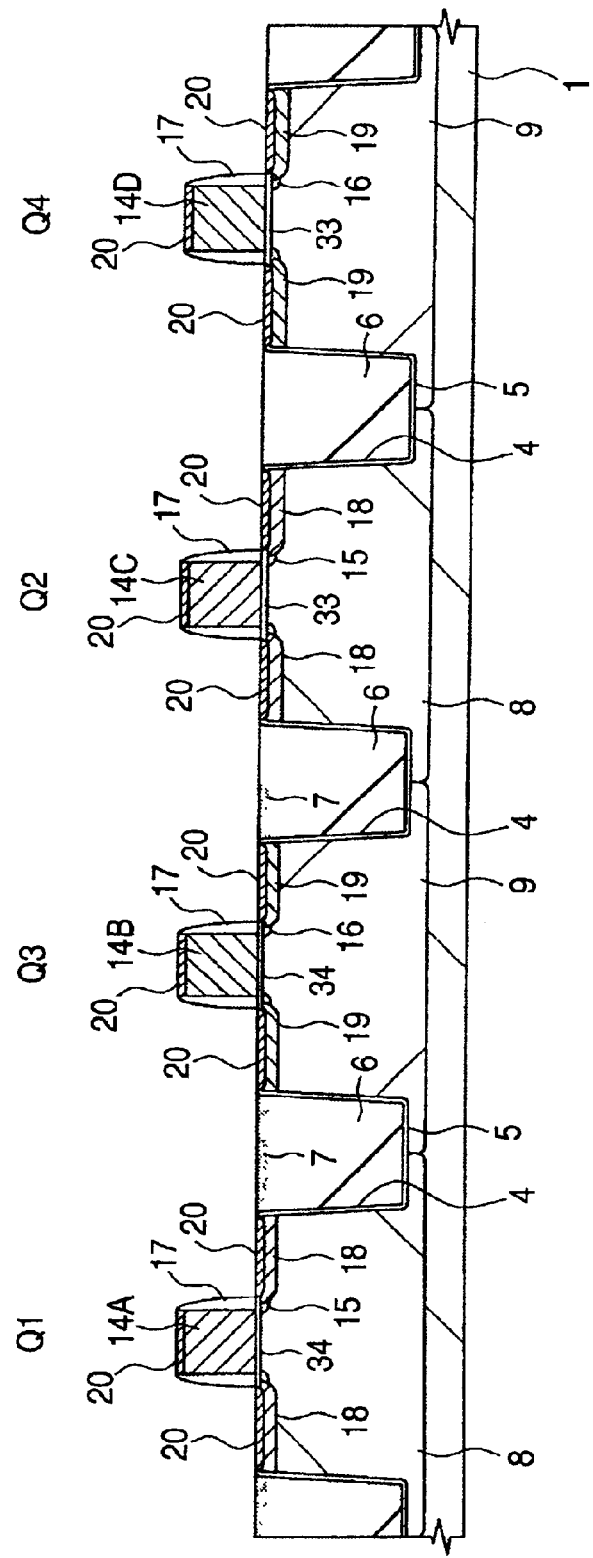
FIG. 41 is a cross-sectional diagram of a main part of the semiconductor substrate showing a step of the semiconductor integrated circuit device fabrication method in accordance with the further embodiment of the invention.

Thereafter, as shown in FIG. 41, n-channel MISFETs Q1 and Q2 and p-channel MISFETs Q3 and 4 are formed in accordance with the processes of the previous embodiment described with reference to FIGS. 21 to 25.

In this way, with the embodiment 5, two types of gate insulating films 33 and 34, that are different in thickness from each other, are formed substantially simultaneously at a single thermal oxidation step; thus, it is possible to shorten the CMOS device fabrication process. Additionally, the requisite number of thermal oxidation and hydrofluoric acid cleaning steps is reduced, thus enabling suppression of oxidation of the inner walls of element isolation grooves 4 and/or recessing of the substrate at active region edges without requiring formation of the nitrogen introduced layer 7 at element isolation grooves 4 in the thick gate insulating film fabrication area.

Optionally, it is also possible to form the two types of gate insulating films 33, 34 of different thicknesses simultaneously at a single thermal oxidation process step by a method which includes the steps of covering the substrate 1 with a photoresist film in the thick gate insulating film fabrication area, after having formed the p- and n-type wells 8 and 9 in the substrate 1 in accordance with the process of the previous embodiment 1 as described with reference to FIGS. 1 to 17, by way of example, and then selectively doping nitrogen by ion implantation into the substrate 1 in the thin gate insulating film formation area.

Figure 42:
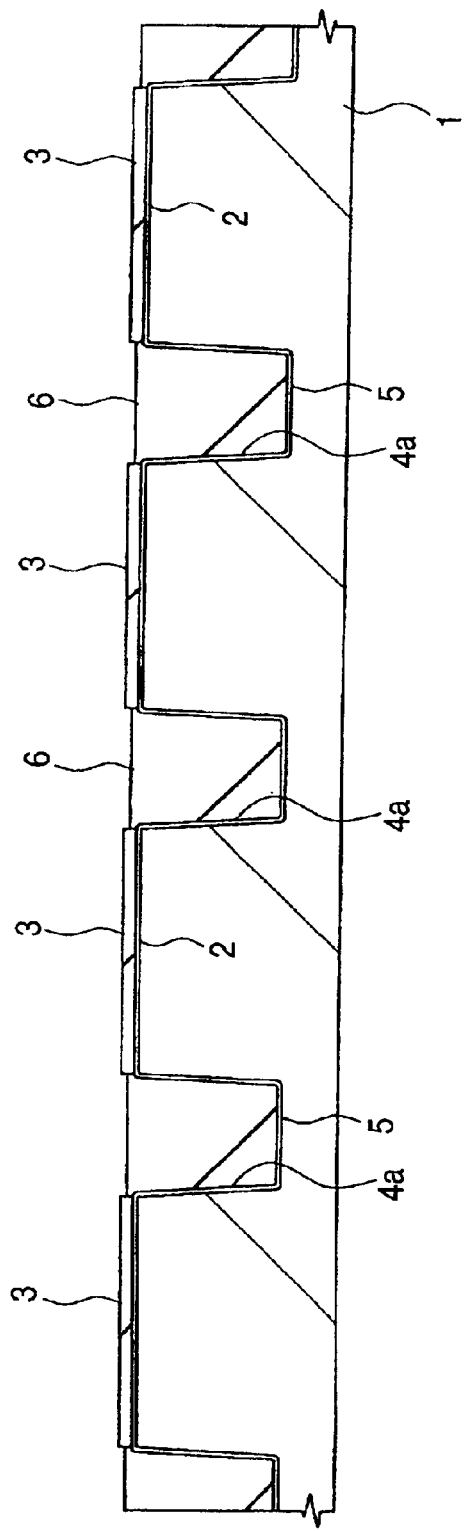
FIG. 42 is a cross-sectional diagram of a main part of a semiconductor substrate showing a step of a semiconductor integrated circuit device fabrication method in accordance with a still further embodiment of the invention.

Embodiment 6:

A sixth embodiment will be discussed using FIGS. 42 to 48. Initially, as shown in FIG. 42, after having formed grooves 4a in the substrate 1 by dry etch techniques using the silicon nitride film 3 as a mask, a silicon oxide film 6, that has been deposited over substrate 1, is planarized by CMP methods. Then, surface portions of the silicon oxide film 6 residing within the grooves 4a are wet-etched using a hydrofluoric acid-based etchant, thereby causing the surface of the silicon oxide film 6 to slightly retrograde downwardly. The process steps up to here are the same as those of the above embodiment 1 as described with reference to FIGS. 1 to 9.

Figure 43:
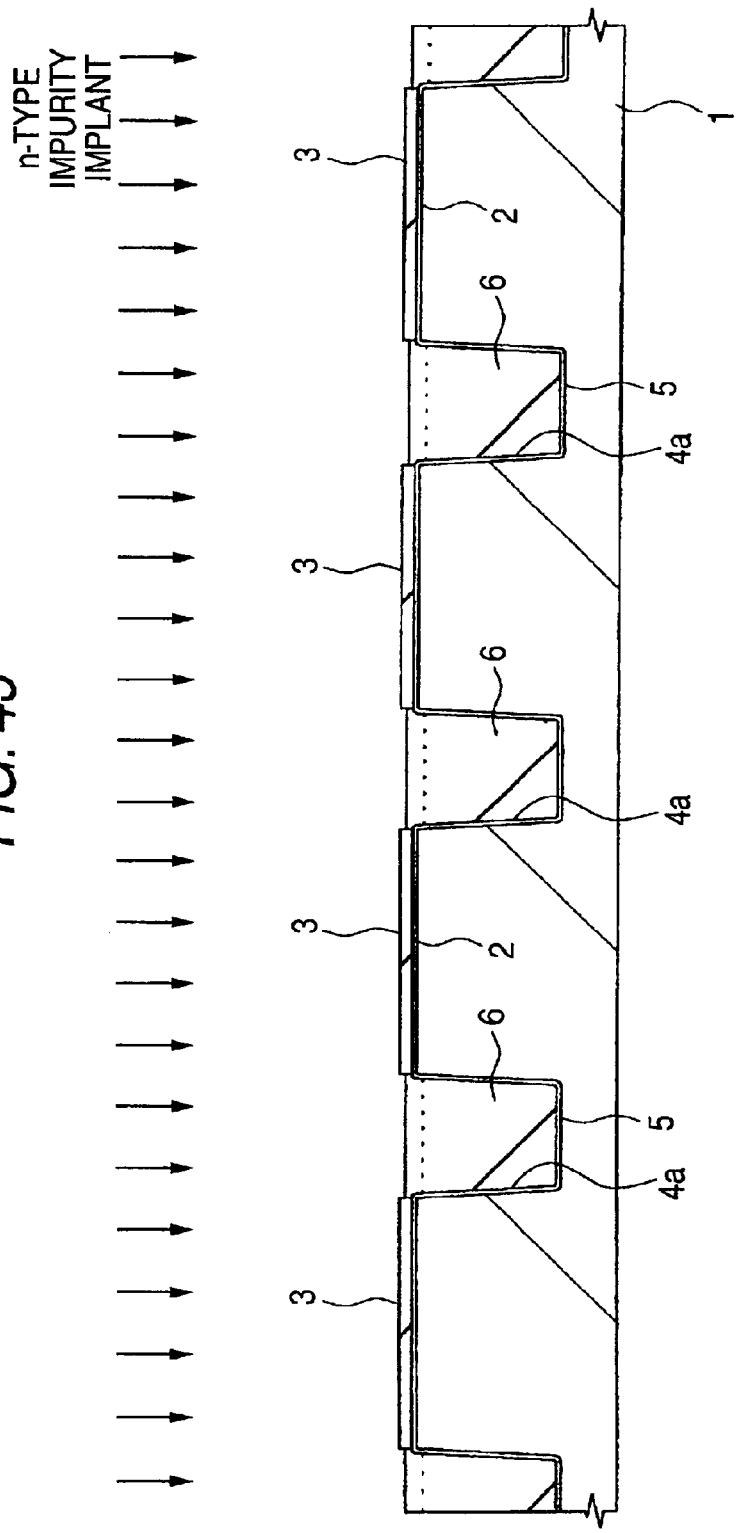
FIG. 43 is a cross-sectional diagram of a main part of the semiconductor substrate showing a step of the semiconductor integrated circuit device fabrication method in accordance with the still further embodiment of the invention.
Figure 44:
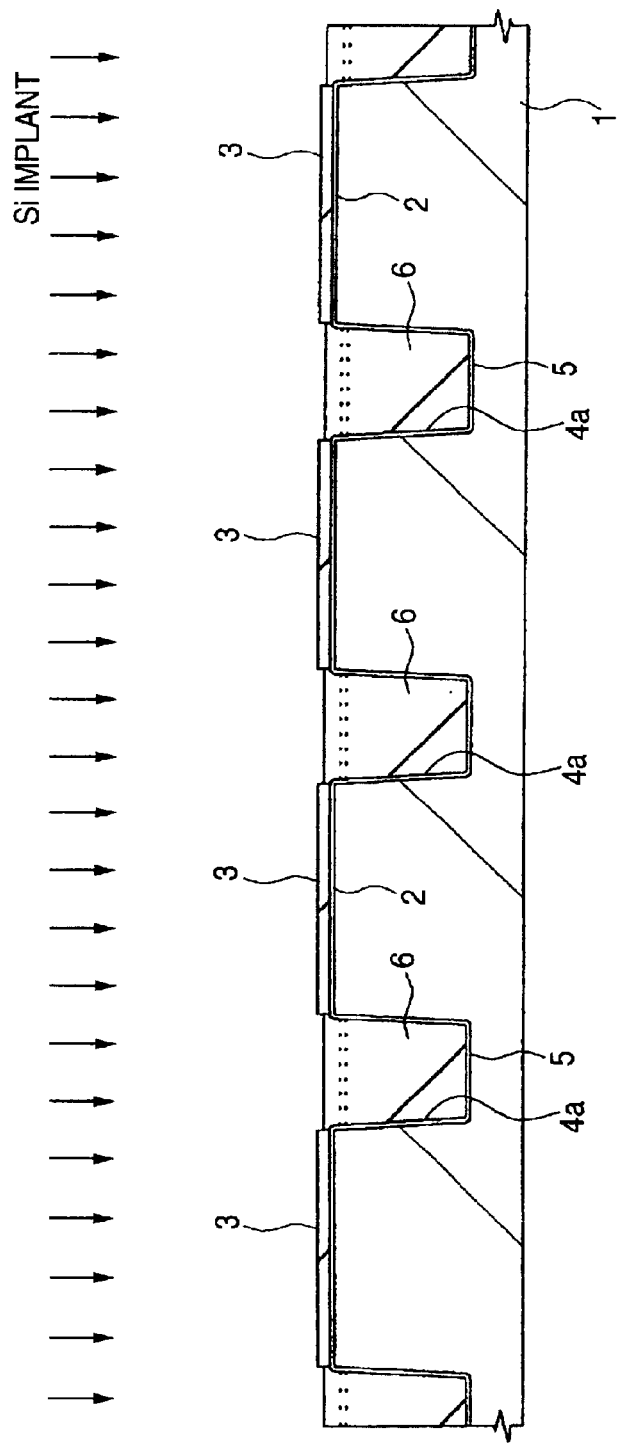
FIG. 44 is a cross-sectional diagram of a main part of the semiconductor substrate showing a step of the semiconductor integrated circuit device fabrication method in accordance with the still further embodiment of the invention.

Next, after having ion-implanted nitrogen into an entire surface of the substrate 1, as shown in FIG. 43, silicon (Si) is ion-implanted into the entire surface of the substrate 1, as shown in FIG. 44. Note here that these nitrogen and silicon ion implantation steps are freely determinable in the order of sequence on a case-by-case basis.

Figure 45:
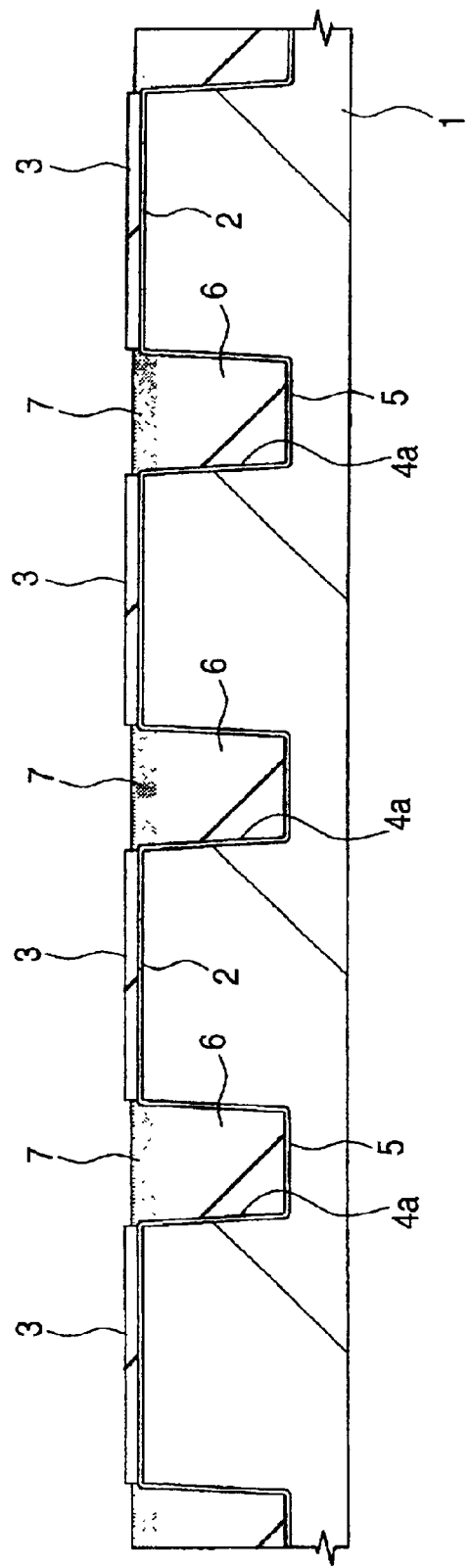
FIG. 45 is a cross-sectional diagram of a main part of the semiconductor substrate showing a step of the semiconductor integrated circuit device fabrication method in accordance with the still further embodiment of the invention.

Next, as shown in FIG. 45, the substrate 1 is thermally processed, forming a nitrogen introduced layer 7 at a surface portion of the silicon oxide film 6. Performing this thermal processing results in creation of the silicon oxynitride (SiON) at the surface portion of silicon oxide film 6 by replacement of part of the Si—O bonds making up the silicon oxide film 6 with Si—N bonds and simultaneously producing of Si—N bonds through reaction of the nitrogen and silicon, as introduced by ion implantation. The subsequent process steps are the same as those of the prescribed Embodiment 1.

In this way, with the embodiment 6, both nitrogen and silicon are ion-implanted into the surface portion of each portion of the silicon oxide film 6 buried in the individual groove 4a and are then forced to react together by application of thermal processing thereto. With such a process scheme, it is possible to readily fabricate the intended nitrogen introduced layer 7 so that at is high in Si—N bond concentration, when compared to the case where nitrogen alone is doped into the silicon oxide film 6, because of the fact that the coupling energy of nitrogen and silicon is lower than the energy required for replacement of Si—O bonds with Si—N bonds; thus, it becomes possible to more effectively suppress oxidation of the inner walls of the grooves 4a and recessing of active region edge portions.

Note here that the nitrogen introduction or doping may alternatively be achievable by use of the previously stated nitrogen plasma method in place of ion implantation methods. More specifically, the nitrogen introduced layer 7 may be formed by a process including the steps of exposing the substrate 1 to a nitrogen plasma atmosphere after or prior to execution of ion implantation of silicon into the entire surface of the substrate 1, and, thereafter, applying thermal processing to the substrate 1.

Figure 46:
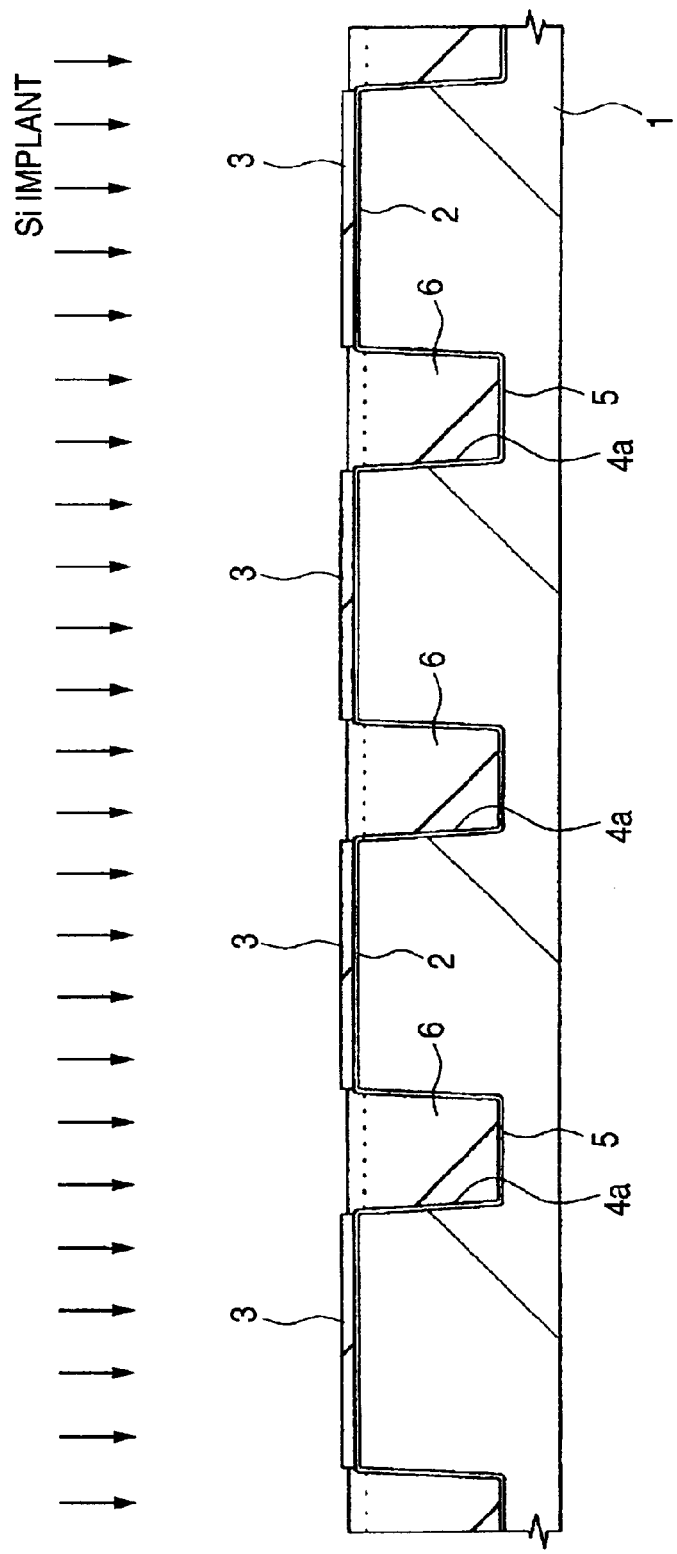
FIG. 46 is a cross-sectional diagram of a main part of the semiconductor substrate showing a step of the semiconductor integrated circuit device fabrication method in accordance with the still further embodiment of the invention.
Figure 47:
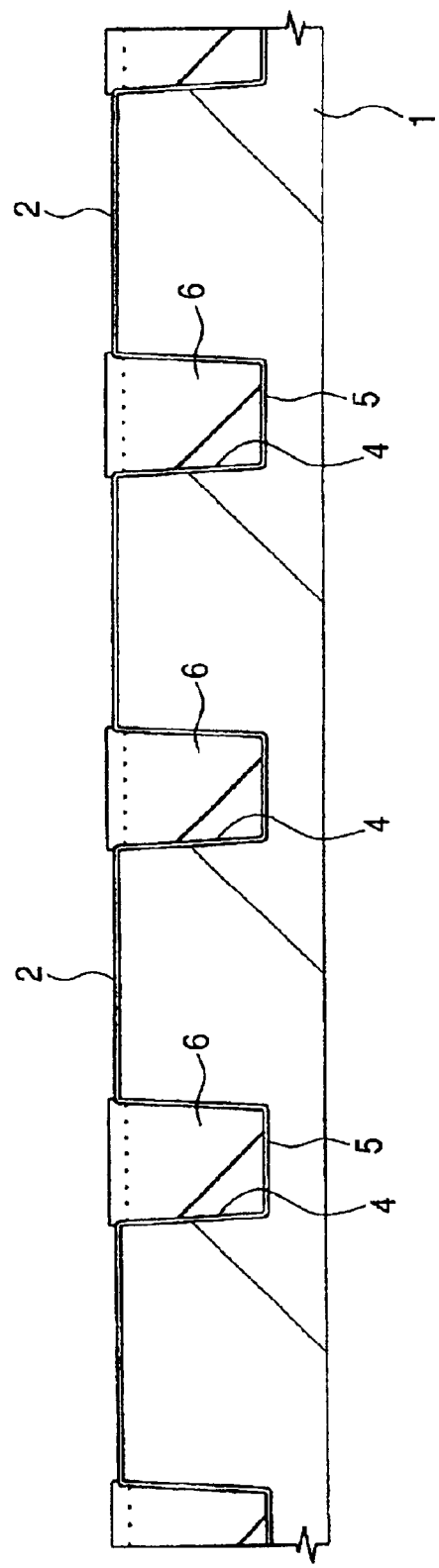
FIG. 47 is a cross-sectional diagram of a main part of the semiconductor substrate showing a step of the semiconductor integrated circuit device fabrication method in accordance with the still further embodiment of the invention.
Figure 48:
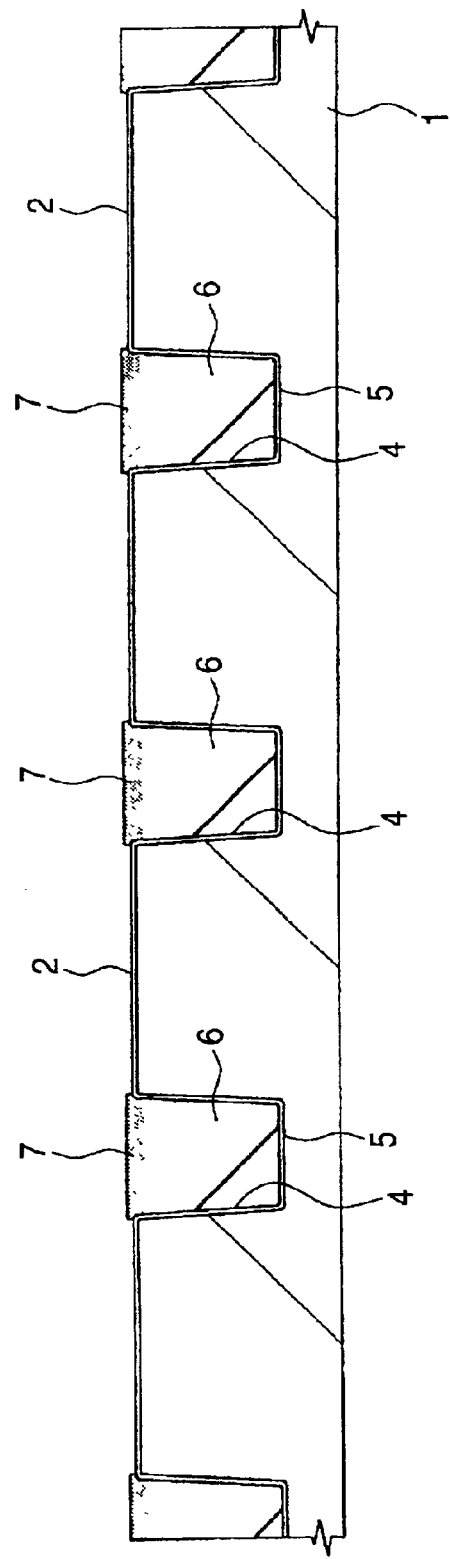
FIG. 48 is a cross-sectional diagram of a main part of the semiconductor substrate showing a step of the semiconductor integrated circuit device fabrication method in accordance with the still further embodiment of the invention.

Alternatively, the nitrogen introduced layer 7 also may be fabricated by utilization of a thermal oxidation process after introduction of silicon and nitride into the silicon oxide film 6. An example of this approach is as follows: after having ion-implanted silicon and nitride into the entire surface of the substrate 1, as shown in FIG. 46, hot phosphoric acid is used to remove the silicon nitride film 3, as shown in FIG. 47; and, thereafter, the substrate 1 is thermally processed, as shown in FIG. 48, to thereby form a nitrogen introduced layer 7 at the surface portion of the silicon oxide film 6. In this case, it is also possible to reduce the requisite nitrogen doping amount and/or eliminate the nitrogen doping process, per se, since the oxidizer in an atmosphere diffusing into the silicon oxide film 6 during thermal processing is consumed through reaction with the silicon.

Furthermore, the method as has been discussed in conjunction with the embodiment 2 is employable to lower the nitrogen concentration of the nitrogen introduced layer 7 at portions adjacent to the active regions in the substrate 1 with or without use of the method described with reference to any one of the embodiments 3 and 4 to form either the silicon nitride film 31 or the nitrogen containing layer 32 along inner walls of the element isolation grooves 4.

Although the invention has been described in detail, based on several embodiments thereof, this invention should not be limited only to these embodiments and may be modifiable and alterable in a variety of ways without departing the spirit and scope of the invention.

For example, a plurality of nitrogen introduced layers may be formed within a silicon oxide film by a process including the steps of performing ion implantation while varying the acceleration energy during ion implantation of nitrogen into the silicon oxide film within an element isolation groove(s), and, thereafter, performing thermal processing.

The thermal processing for formation of the nitrogen introduced layer need not necessarily be performed immediately after introduction of nitrogen into the silicon oxide film within the element isolation groove(s) and may alternatively be achieved by utilizing thermal processing to be carried out later.

Although the embodiments described above are specifically directed to CMOS device applications, the principles of the present invention, as disclosed and claimed herein, may also be applied to other types of MOS devices having a plurality of gate insulating films of different thicknesses, including, but not limited to, flash memories, memory-embedded logic devices, and the like.

A brief explanation of the effects and advantages obtainable by representative aspects of the invention as disclosed herein is as follows.

By introducing nitrogen into a surface portion of a silicon oxide film buried in an element isolation groove, it becomes possible to effectively suppress unwanted oxidation of the inner walls of the element isolation groove otherwise occurring during thermal oxidation processes.

Introducing nitrogen into the surface portion of a silicon oxide film buried within an element isolation groove makes it possible to effectively suppress the recessing of the element isolation groove, which tends to occur during hydrofluoric acid cleaning steps.

What is claimed is:

1. A method of fabricating a semiconductor integrated circuit device, comprising:

(a) exposing a first area of a semiconductor substrate principal surface to thereby selectively form a first insulative film at the semiconductor substrate principal surface of a second area as surrounded by the first area;

(b) forming a groove in the semiconductor substrate surface of the first area;

(c) forming a second insulative film within the groove and over the first insulative film to bury the groove;

(d) polishing the second insulative film to cause the second insulative film to selectively remain within the groove;

(e) etching the second insulative film thereby letting a surface of the second insulative film be lower than a surface of the first insulative film;

(f) after said step (e), forming a third insulative film over the first and second insulative films;

(g) after said step (f), introducing nitrogen into the second insulative film in the first area through the third insulative film; and (h) after said step (g), removing the first and third insulative films of the second area.

2. The method of fabricating a semiconductor integrated circuit device according to claim 1, wherein the nitrogen is prevented from being introduced into a lower portion of the third insulative film formed along a side wall of the first insulative film.

3. A method of fabricating a semiconductor integrated circuit device, comprising:

(a) exposing a first area of a semiconductor substrate principal surface to thereby selectively form a first insulative film at the semiconductor substrate principal surface of a second area surrounded by the first area;

(b) forming a groove in the semiconductor substrate surface of the first area;

(c) forming a second insulative film within the groove and over the first insulative film to bury the groove;

(d) polishing the second insulative film to cause the second insulative film to selectively remain within the groove;

(e) etching the second insulative film thereby letting a surface of the second insulative film be lower than a surface of the first insulative film;

(f) after said step (e), forming a third insulative film over the first and second insulative films;

(g) after said step (f), introducing nitrogen into the second insulative film in the first area through the third insulative film; and (h) after the step (g), removing the first and third insulative films of the second area, wherein at said step (g), a nitrogen introduction layer is formed at a surface of the second insulative film, and wherein a ratio of an Si—N bond at a surface of the nitrogen introduction layer is lower than the ratio of the Si—N bond inside the nitrogen introduction layer.

4. A method of fabricating a semiconductor integrated circuit device, comprising:

(a) exposing a first area of a semiconductor substrate principal surface to thereby selectively form a first insulative film at the semiconductor substrate principal surface of a second area surrounded by the first area;

(b) forming a groove in the semiconductor substrate surface of the first area;

(c) forming a second insulative film within the groove and over the first insulative film to bury the groove;

(d) polishing the second insulative film to cause the second insulative film to selectively remain within the groove;

(e) etching the second insulative film thereby letting a surface of the second insulative film be lower than a surface of the first insulative film;

(f) after said step (e), forming a third insulative film over the first and second insulative films;

(g) after said step (e), introducing nitrogen into the second insulative film in the first area through the third insulative film; and (h) after the step (g), removing the first and third insulative films of the second area, wherein at said step (g), a nitrogen introduction layer is formed at a surface of the second insulative film, and wherein the nitrogen concentration of the adjacent portion to the second area of the nitrogen introduction layer is lower than that of the central portion of the nitrogen introduction layer.

5. A method of fabricating a semiconductor integrated circuit device, comprising:

(a) exposing a first area of a semiconductor substrate principal surface to thereby selectively form a first silicon nitride film at the semiconductor substrate principal surface of a second area surrounded by the first area;

(b) forming a groove in the semiconductor substrate surface of the first area;

(c) forming a first silicon oxide film within the groove and over the first silicon nitride film to bury the groove;

(d) polishing the first silicon oxide film to cause the first silicon nitride film to selectively remain within the groove;

(e) etching the first silicon oxide film by a wet etching method, thereby letting a surface of the first silicon nitride film be lower than a surface of the first silicon oxide film;

(f) after said step (e), forming a second silicon nitride film over the first and second insulative films;

(g) after said step (g), introducing nitrogen into the first silicon oxide film in the first area through the second silicon nitride film; and (h) after the step (g), removing the first and second silicon nitride films of the second area, wherein at said step (g), a nitrogen introduction layer is formed at a surface of the first silicon oxide film, wherein a ratio of an Si—N bond at a surface of the nitrogen introduction layer is lower than the ratio of the Si—N bond inside the nitrogen introduction layer, and wherein the nitrogen concentration of the adjacent portion to the second area of the nitrogen introduction layer is lower than that of the central portion of the nitrogen introduction layer.

6. A method of fabricating a semiconductor integrated circuit device according to claim 1, between said step (b) and step (c), further including the steps of:

(i) forming a first oxide film at a surface of the groove; and (j) after said step (i), thermally processing the semiconductor substrate in a nitrogen-containing atmosphere.

7. A method of fabricating a semiconductor integrated circuit device according to claim 1, between said step (b) and step (c), further including the step of (k) forming a first nitride film over a surface of the groove by a CVD method.

8. The method of fabricating a semiconductor integrated circuit device according to claim 1, wherein introduction of the nitrogen is done in a plasma atmosphere.

9. The method of fabricating a semiconductor integrated circuit device according to claim 1, wherein thermal processing is applied to the semiconductor substrate after having introduced the nitrogen.

10. A method of fabricating a semiconductor integrated circuit device according to claim 3, between said step (b) and step (c), further including the steps of:

(i) forming a first oxide film at a surface of the groove; and (j) after said step (i), thermally processing the semiconductor substrate in a nitrogen-containing atmosphere.

11. A method of fabricating a semiconductor integrated circuit device according to claim 3, between said step (b) and step (c), further including the step of:

(k) forming a first nitride film over a surface of the groove by a CVD method.

12. The method of fabricating a semiconductor integrated circuit device according to claim 3, wherein introduction of the nitrogen is done in a plasma atmosphere.

13. The method of fabricating a semiconductor integrated circuit device according to claim 3, wherein thermal processing is applied to the semiconductor substrate after having introduced the nitrogen.

14. A method of fabricating a semiconductor integrated circuit device according to claim 4, between said step (b) and step (c), further including the steps of:

(i) forming a first oxide film at a surface of the groove; and (j) after said step (i), thermally processing the semiconductor substrate in a nitrogen-containing atmosphere.

15. A method of fabricating a semiconductor integrated circuit device according to claim 4, between said step (b) and step (c), further including the step of:

(k) forming a first nitride film over a surface of the groove by a CVD method.

16. The method of fabricating a semiconductor integrated circuit device according to claim 4, wherein introduction of the nitrogen is done in a plasma atmosphere.

17. The method of fabricating a semiconductor integrated circuit device according to claim 4, wherein thermal processing is applied to the semiconductor substrate after having introduced the nitrogen.

18. A method of fabricating a semiconductor integrated circuit device according to claim 5, between said step (b) and step (c), further including the steps of:

(i) forming a second oxide film at a surface of the groove; and (j) after the step (i), thermally processing the semiconductor substrate in a nitrogen-containing atmosphere.

19. A method of fabricating a semiconductor integrated circuit device according to claim 5, between said step (b) and step (c), further including the step of:

(k) forming a third nitride film over a surface of the groove by a CVD method.

20. The method of fabricating a semiconductor integrated circuit device according to claim 5, wherein introduction of the nitrogen is done in a plasma atmosphere.

21. The method of fabricating a semiconductor integrated circuit device according to claim 5, wherein thermal processing is applied to the semiconductor substrate after having introduced the nitrogen.

* * * * *